US012750030B2

(12) United States Patent
Goto et al.

(10) Patent No.: US 12,750,030 B2
(45) Date of Patent: Sep. 29, 2026

(54) BOUNDARY ACOUSTIC WAVE DEVICE WITH MULTI-LAYER PIEZOELECTRIC SUBSTRATE

(71) Applicant: Skyworks Solutions, Inc., Irvine, CA (US)

(72) Inventors: Rei Goto, Osaka (JP); Hironori Fukuhara, Ibaraki (JP)

(73) Assignee: Skyworks Solutions, Inc., Irvine, CA (US)

( * ) Notice: Subject to any disclaimer, the term of this patent is extended or adjusted under 35 U.S.C. 154(b) by 972 days.

(21) Appl. No.: 18/054,631

(22) Filed: Nov. 11, 2022

(65) Prior Publication Data

US 2023/0208384 A1 Jun. 29, 2023

Related U.S. Application Data

(60) Provisional application No. 63/265,966, filed on Dec. 23, 2021.

(51) Int. Cl.
*H03H 9/02* (2006.01)
*H03H 3/02* (2006.01)
(Continued)

(52) U.S. Cl.
CPC ............ *H03H 9/0222* (2013.01); *H03H 3/02* (2013.01); *H03H 9/02559* (2013.01);
(Continued)

(58) Field of Classification Search
CPC ............. H03H 9/0222; H03H 9/02559; H03H 9/14541; H10N 30/50; H10N 30/871; H10N 30/874; H10N 30/20
(Continued)

(56) References Cited

U.S. PATENT DOCUMENTS

| | | | |
|---|---|---|---|
| 5,626,767 | A | 5/1997 | Trampler et al. |
| 5,910,756 | A | 6/1999 | Ella |

(Continued)

FOREIGN PATENT DOCUMENTS

| | | |
|---|---|---|
| CN | 107470116 | 12/2017 |
| DE | 102012205033 B4 | 1/2020 |

(Continued)

OTHER PUBLICATIONS

Kimura et al., "A High Velocity and Wideband SAW on a Thin LiNbO3 Plate Bonded on a Si Substrate in the SHF Range", IEEE International Ultrasonics Symposium (2019).

(Continued)

*Primary Examiner* — Derek J Rosenau
(74) *Attorney, Agent, or Firm* — Knobbe, Martens, Olson & Bear, LLP

(57) ABSTRACT

Aspects of this disclosure relate to a boundary acoustic wave device. The boundary acoustic wave device can include two low acoustic impedance layers, an interdigital transducer electrode, piezoelectric material positioned between the interdigital transducer electrode and each of the two low acoustic impedance layers, and two high acoustic impedance substrates. The two low acoustic impedance layers can be positioned between the two high acoustic impedance substrates. Related acoustic wave filters, multiplexers, radio frequency modules, wireless communication devices, and methods are disclosed.

20 Claims, 13 Drawing Sheets

(51) Int. Cl.
*H03H 9/145* (2006.01)
*H03H 9/25* (2006.01)
*H10N 30/20* (2023.01)
*H10N 30/50* (2023.01)
*H10N 30/87* (2023.01)

(52) U.S. Cl.
CPC .......... *H03H 9/14541* (2013.01); *H03H 9/25* (2013.01); *H10N 30/20* (2023.02); *H10N 30/50* (2023.02); *H10N 30/871* (2023.02); *H10N 30/874* (2023.02)

(58) Field of Classification Search
USPC ...... 310/313 R, 313 A, 313 B, 313 C, 313 D
See application file for complete search history.

(56) References Cited

U.S. PATENT DOCUMENTS

| | | | |
|---|---|---|---|
| 6,262,637 | B1 | 7/2001 | Bradley et al. |
| 6,445,265 | B1 | 9/2002 | Wright |
| 6,509,813 | B2 | 1/2003 | Ellae et al. |
| 7,235,915 | B2 | 6/2007 | Nakamura et al. |
| 7,322,093 | B2 | 1/2008 | Kadota et al. |
| 7,471,027 | B2 | 12/2008 | Kando |
| 7,550,898 | B2 | 6/2009 | Kadota et al. |
| 7,576,471 | B1 | 8/2009 | Solal |
| 7,616,079 | B2 | 11/2009 | Tikka et al. |
| 7,733,198 | B1 | 6/2010 | Olsson et al. |
| 7,786,825 | B2 | 8/2010 | Handtmann et al. |
| 7,898,145 | B2 | 3/2011 | Mimura et al. |
| 7,902,717 | B2 | 3/2011 | Saijou et al. |
| 8,138,856 | B2 | 3/2012 | Khelif et al. |
| 8,248,185 | B2 | 8/2012 | Choy et al. |
| 8,294,331 | B2 | 10/2012 | Abbott et al. |
| 8,525,619 | B1 | 9/2013 | Olsson et al. |
| 8,575,820 | B2 | 11/2013 | Shirakawa et al. |
| 8,610,518 | B1 | 12/2013 | Solal et al. |
| 8,741,683 | B2 | 6/2014 | Huang et al. |
| 8,836,449 | B2 | 9/2014 | Pang et al. |
| 8,852,104 | B2 | 10/2014 | Oralkan et al. |
| 9,136,818 | B2 | 9/2015 | Burak et al. |
| 9,219,466 | B2 | 12/2015 | Meltaus et al. |
| 9,893,712 | B2 | 2/2018 | Meltaus et al. |
| 10,090,825 | B2 | 10/2018 | Kuroyanagi |
| 10,097,158 | B2 | 10/2018 | Kaneda et al. |
| 10,164,605 | B2 | 12/2018 | Burak et al. |
| 10,211,806 | B2 | 2/2019 | Bhattacharjee |
| 10,243,536 | B2 | 3/2019 | Saijo et al. |
| 10,250,222 | B2 | 4/2019 | Kuroyanagi et al. |
| 10,305,443 | B2 | 5/2019 | Bhattacharjee |
| 10,374,573 | B2 | 8/2019 | Bhattacharjee |
| 10,389,332 | B2 | 8/2019 | Bhattacharjee |
| 10,453,636 | B1 | 10/2019 | Khlat |
| 10,601,392 | B2 | 3/2020 | Plesski et al. |
| 10,601,398 | B2 | 3/2020 | Sturzebecher et al. |
| 10,819,309 | B1 | 10/2020 | Turner et al. |
| 11,101,787 | B2 | 8/2021 | Ando et al. |
| 11,309,866 | B2 | 4/2022 | Omura |
| 11,368,137 | B2 | 6/2022 | Goto et al. |
| 11,463,065 | B2 | 10/2022 | Goto |
| 11,552,614 | B2 | 1/2023 | Caron et al. |
| 11,616,487 | B2 | 3/2023 | Nakamura et al. |
| 11,689,178 | B2 | 6/2023 | Nakamura et al. |
| 11,799,443 | B2 | 10/2023 | Omura et al. |
| 11,894,828 | B2 | 2/2024 | Nakamura et al. |
| 12,009,797 | B2 | 6/2024 | Goto |
| 12,063,026 | B2 | 8/2024 | Caron et al. |
| 12,119,804 | B2 | 10/2024 | Yamane et al. |
| 12,136,910 | B2 | 11/2024 | Goto |
| 12,334,899 | B2 | 6/2025 | Nakamura et al. |
| 12,341,486 | B2 | 6/2025 | Shin et al. |
| 12,355,423 | B2 | 7/2025 | Torazawa et al. |
| 12,413,203 | B2 | 9/2025 | Kimura |
| 2005/0005323 | A1 | 1/2005 | Birch et al. |
| 2005/0057323 | A1 | 3/2005 | Kando et al. |
| 2005/0206476 | A1 | 9/2005 | Ella et al. |
| 2006/0138902 | A1 | 6/2006 | Kando |
| 2007/0176710 | A1 | 8/2007 | Jamneala et al. |
| 2007/0267942 | A1* | 11/2007 | Matsumoto ............ H03H 9/178 310/366 |
| 2008/0169574 | A1 | 7/2008 | Molkkari et al. |
| 2008/0169884 | A1 | 7/2008 | Matsumoto et al. |
| 2008/0204857 | A1 | 8/2008 | Godshalk et al. |
| 2008/0297280 | A1 | 12/2008 | Thalhammer et al. |
| 2009/0009262 | A1 | 1/2009 | Schmidhammer et al. |
| 2009/0096550 | A1 | 4/2009 | Handtmann et al. |
| 2009/0115287 | A1 | 5/2009 | Kando |
| 2009/0265903 | A1 | 10/2009 | Handtmann et al. |
| 2009/0267457 | A1 | 10/2009 | Barber et al. |
| 2010/0244624 | A1 | 9/2010 | Matsuda et al. |
| 2011/0084779 | A1 | 4/2011 | Zhang |
| 2011/0109196 | A1* | 5/2011 | Goto .................. H03H 9/02228 310/313 C |
| 2011/0193655 | A1 | 8/2011 | Kamiguchi et al. |
| 2011/0241481 | A1 | 10/2011 | Kimura et al. |
| 2011/0266917 | A1 | 11/2011 | Metzger et al. |
| 2011/0273243 | A1 | 11/2011 | Domingue et al. |
| 2012/0025931 | A1 | 2/2012 | Yamamoto et al. |
| 2012/0049690 | A1 | 3/2012 | Okamoto et al. |
| 2012/0164753 | A1 | 6/2012 | Johnston et al. |
| 2012/0198672 | A1 | 8/2012 | Ueda et al. |
| 2013/0026881 | A1 | 1/2013 | Okamoto et al. |
| 2013/0051588 | A1 | 2/2013 | Ruile et al. |
| 2013/0099630 | A1 | 4/2013 | Matsuda et al. |
| 2013/0176085 | A1 | 7/2013 | Barber et al. |
| 2013/0285768 | A1 | 10/2013 | Watanabe et al. |
| 2014/0003196 | A1 | 1/2014 | Tajima |
| 2014/0203893 | A1 | 7/2014 | Kando et al. |
| 2014/0217566 | A1 | 8/2014 | Goida et al. |
| 2015/0028720 | A1 | 1/2015 | Kando |
| 2015/0102705 | A1 | 4/2015 | Iwamoto et al. |
| 2015/0243873 | A1 | 8/2015 | Nakanishi et al. |
| 2016/0044677 | A1 | 2/2016 | King et al. |
| 2016/0149553 | A1 | 5/2016 | Yoon et al. |
| 2017/0141752 | A1 | 5/2017 | Hino |
| 2017/0170808 | A1 | 6/2017 | Iwaki et al. |
| 2017/0179920 | A1 | 6/2017 | Kawasaki |
| 2017/0201234 | A1 | 7/2017 | Jger et al. |
| 2017/0214388 | A1 | 7/2017 | Irieda et al. |
| 2017/0250674 | A1 | 8/2017 | Takamine et al. |
| 2017/0331451 | A1 | 11/2017 | Yoon et al. |
| 2017/0366163 | A1 | 12/2017 | Kishimoto |
| 2018/0019832 | A1 | 1/2018 | Okuda |
| 2018/0054179 | A1 | 2/2018 | Gamble et al. |
| 2018/0097508 | A1 | 4/2018 | Iwamoto et al. |
| 2018/0269852 | A1 | 9/2018 | Daimon et al. |
| 2018/0287587 | A1 | 10/2018 | Campanella et al. |
| 2019/0028082 | A1 | 1/2019 | Jaeger et al. |
| 2019/0089328 | A1 | 3/2019 | Unterreithmeier |
| 2019/0097606 | A1 | 3/2019 | Nosaka et al. |
| 2019/0103853 | A1 | 4/2019 | Burak et al. |
| 2019/0149123 | A1 | 5/2019 | Sakashita |
| 2019/0181827 | A1 | 6/2019 | Timme et al. |
| 2019/0199324 | A1 | 6/2019 | Matsumoto et al. |
| 2019/0253036 | A1 | 8/2019 | Han et al. |
| 2019/0326874 | A1 | 10/2019 | Nakamura et al. |
| 2019/0326875 | A1 | 10/2019 | Nakamura et al. |
| 2019/0326879 | A1 | 10/2019 | Nakamura et al. |
| 2019/0341885 | A1 | 11/2019 | Jackson et al. |
| 2019/0356296 | A1 | 11/2019 | Mimura |
| 2019/0393924 | A1 | 12/2019 | Campbell |
| 2020/0028487 | A1 | 1/2020 | Caron |
| 2020/0067482 | A1 | 2/2020 | Maki et al. |
| 2020/0083860 | A1 | 3/2020 | Ylilammi et al. |
| 2020/0091892 | A1 | 3/2020 | Watanabe et al. |
| 2020/0106420 | A1 | 4/2020 | Kodama et al. |
| 2020/0144984 | A1 | 5/2020 | Fukuhara et al. |
| 2020/0228089 | A1 | 7/2020 | Tajic et al. |
| 2020/0304092 | A1 | 9/2020 | Suzuki et al. |
| 2020/0304096 | A1 | 9/2020 | Suzuki et al. |
| 2020/0328727 | A1 | 10/2020 | Daimon |
| 2020/0358423 | A1 | 11/2020 | Pao et al. |
| 2020/0366268 | A1* | 11/2020 | Goto .................. H03H 9/02574 |
| 2021/0044278 | A1 | 2/2021 | Kankar et al. |

(56) References Cited

U.S. PATENT DOCUMENTS

| | | | |
|---|---|---|---|
| 2021/0091742 | A1 | 3/2021 | Gorisse et al. |
| 2021/0111135 | A1 | 4/2021 | Li et al. |
| 2021/0119602 | A1 | 4/2021 | Lu et al. |
| 2021/0126625 | A1 | 4/2021 | Wang et al. |
| 2021/0143793 | A1 | 5/2021 | Shirakawa et al. |
| 2021/0159877 | A1 | 5/2021 | Fukuhara et al. |
| 2021/0203305 | A1 | 7/2021 | Maki et al. |
| 2021/0313950 | A1 | 10/2021 | Han et al. |
| 2021/0399711 | A1 | 12/2021 | Ajima et al. |
| 2021/0408994 | A1 | 12/2021 | Nagatomo et al. |
| 2022/0140224 | A1 | 5/2022 | Hamasaki et al. |
| 2022/0149803 | A1 | 5/2022 | Shuai et al. |
| 2022/0158612 | A1 | 5/2022 | Goto et al. |
| 2022/0200566 | A1 | 6/2022 | Kadota et al. |
| 2022/0216846 | A1 | 7/2022 | Yamane et al. |
| 2022/0231651 | A1 | 7/2022 | Luo |
| 2022/0286105 | A1 | 9/2022 | Goto et al. |
| 2022/0321079 | A1 | 10/2022 | Liu |
| 2022/0321088 | A1 | 10/2022 | Goto et al. |
| 2022/0321095 | A1 | 10/2022 | Liu et al. |
| 2022/0321096 | A1 | 10/2022 | Goto et al. |
| 2022/0407487 | A1 | 12/2022 | Liu |
| 2023/0103956 | A1 | 4/2023 | Fukuhara et al. |
| 2023/0104500 | A1 | 4/2023 | Fukuhara et al. |
| 2023/0105034 | A1 | 4/2023 | Fukuhara et al. |
| 2023/0107728 | A1 | 4/2023 | Fukuhara et al. |
| 2023/0107820 | A1 | 4/2023 | Fukuhara et al. |
| 2023/0108686 | A1 | 4/2023 | Fukuhara et al. |
| 2023/0111476 | A1 | 4/2023 | Fukuhara et al. |
| 2023/0123285 | A1 | 4/2023 | Goto et al. |
| 2023/0283255 | A1 | 9/2023 | Nakamura et al. |
| 2023/0378930 | A1 | 11/2023 | Goto et al. |
| 2024/0113679 | A1 | 4/2024 | Goto et al. |
| 2024/0356515 | A1 | 10/2024 | Goto |
| 2024/0356516 | A1 | 10/2024 | Caron et al. |
| 2025/0023554 | A1 | 1/2025 | Okada et al. |
| 2025/0030401 | A1 | 1/2025 | Goto |

FOREIGN PATENT DOCUMENTS

| | | |
|---|---|---|
| EP | 2658123 | 10/2013 |
| JP | H05-95249 | 4/1993 |
| JP | 3710445 | 10/2005 |
| JP | 2011-066492 | 3/2011 |
| JP | 2015-146333 | 8/2015 |
| JP | 2017-528060 | 9/2017 |
| KR | 10-0799438 B1 | 1/2008 |
| KR | 10-2013-0086378 | 8/2013 |
| SG | 10-2020-12058 | 7/2021 |
| TW | 2009-35738 | 8/2009 |
| TW | 2010-21409 | 6/2010 |
| TW | 2013-47165 | 11/2013 |
| WO | WO 1998/52279 | 11/1998 |
| WO | WO 2010/004741 | 1/2010 |
| WO | WO 2011/046117 | 4/2011 |
| WO | WO 2011/158445 | 12/2011 |
| WO | WO 2012/086639 | 6/2012 |
| WO | WO 2017/043427 | 3/2017 |
| WO | WO 2017/068828 | 4/2017 |
| WO | WO 2017/138540 | 8/2017 |
| WO | 2017/161303 A1 | 9/2017 |

OTHER PUBLICATIONS

Mimura, M., et al., "Low Acoustic Velocity Rayleigh SAW Technology for Miniaturization of High Performance TC-SAW Devices", Seventh International Symposium on Acoustic Wave Devices for Future Mobile Communication Systems., Mar. 7, 2018, 8 pages.

Nakamura, H., et al., "Suppression Mechanism of Transverse-Mode Spurious Responses in SAW Resonators on a SiO2/Al/LiNbO3 Structure", IEEE International Ultrasonics Symposium Proceedings, 2011, 4 pages.

Plessky et al., "Laterally excited bulk wave resonators (XBARs) based on thin Lithium Niobate platelet for 5GHz and 13 GHz filters", IEEE/MTT-S International Microwave Symposium, pp. 512-515 (2019).

Written Opinion in application No. 10202012082V, dated Sep. 15, 2023.

Yen et al., "Integrated High-performance Clocking Solutions Utilizing Mirror-encapsulated BAW Resonators", Program Digest, 2019 IEEE International Ultrasonics Symposium (IUS), Glasgow, Scotland (Oct. 6-9, 2019).

Drafts, Bill, "Acoustic Wave Technology Sensors", Fierce Electronics article, Oct. 1, 2000.

Kando et al., "RF Filter using Boundary Acoustic Wave," Japanese Journal of Applied Physics, vol. 45, No. 5B, May 25, 2006, pp. 4651-4654.

Kando et al., "RF Filter using Boundary Acoustic Wave," 2006 IEEE Ultrasonics Symposium, pp. 188-191.

Irino, Toshio, et al., "Propagation of Boundary Acoustic Waves along a ZnO Layer between Two Materials," IEEE Ultrasonics Symposium, 1986, pp. 195-200.

Pitschi et al., "Approaches to wafer level packaging for SAW components", 2013 IEEE MTT-S International Microwave Symposium Digest (MTT), 2013.

Wang, Yiliu, et al., "Change in Piezoelectric Boundary Acoustic Wave Characteristics with Overlay and Metal Grating Materials," Conference Paper, Apr. 2009, pp. 241-244.

Yamane, Takashi, et al., "A Miniaturized UMTS Band II Duplexer Employing Piezoelectric Boundary Acoustic Wave," Proceedings of the Asia-Pacific Microwave Conference 2011, pp. 550-553.

Aslam et al., "Surface acoustic wave modes characteristics of CMOS compatible SiO2/AlN/SiO2/Si multilayer structure with embedded electrodes", Sensors and Actuators A: Physical, vol. 313:112202 (2020).

* cited by examiner

BOUNDARY ACOUSTIC WAVE DEVICE WITH MULTI-LAYER PIEZOELECTRIC SUBSTRATE

CROSS REFERENCE TO PRIORITY APPLICATION

Any and all applications for which a foreign or domestic priority claim is identified in the Application Data Sheet as filed with the present application are hereby incorporated by reference under 37 C.F.R. § 1.57. This application claims the benefit of priority of U.S. Provisional Application No. 63/265,966, filed Dec. 23, 2021 and titled "BOUNDARY ACOUSTIC WAVE DEVICE WITH MULTI-LAYER PIEZOELECTRIC SUBSTRATE," the disclosure of which is hereby incorporated by reference in its entirety and for all purposes.

BACKGROUND

Technical Field

Embodiments of this disclosure relate to acoustic wave devices. More specifically, embodiments disclosed herein relate to boundary acoustic wave devices.

Description of Related Technology

Acoustic wave filters can be implemented in radio frequency electronic systems. For instance, filters in a radio frequency front end of a mobile phone can include acoustic wave filters. A plurality of acoustic wave filters coupled to a common node can be arranged as a multiplexer. For example, two acoustic wave filters can be arranged as a duplexer.

An acoustic wave filter can include a plurality of acoustic wave resonators arranged to filter a radio frequency signal. Example acoustic wave filters include surface acoustic wave (SAW) filters, boundary acoustic wave filters, and bulk acoustic wave (BAW) filters.

A boundary acoustic wave resonator can concentrate acoustic energy near a boundary of two materials of the boundary acoustic wave device. Boundary acoustic wave resonators that are relatively small in size with relatively good electrical performance are generally desirable.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is a boundary acoustic wave device. The boundary acoustic wave device includes two low acoustic impedance layers, an interdigital transducer electrode. piezoelectric material on opposing sides of the interdigital transducer electrode such that the piezoelectric material is positioned between the interdigital transducer electrode and each of the two low acoustic impedance layers and two high acoustic impedance substrates. The two low acoustic impedance layers are positioned between the two high acoustic impedance substrates. The two low acoustic impedance layers each have a lower acoustic impedance than each of the two high acoustic impedance substrates. The two high acoustic impedance substrates each have a higher acoustic impedance than the piezoelectric material. The boundary acoustic wave device is configured to generate a boundary acoustic wave.

The interdigital transducer electrode can be embedded in the piezoelectric material. The interdigital transducer electrode can be bonded to a layer of the piezoelectric material.

The boundary acoustic wave device can include dielectric material located between interdigital transducer electrode fingers of the interdigital transducer electrode.

The interdigital transducer electrode can be in contact with the piezoelectric material on only one of the opposing sides of the interdigital transducer electrode.

The boundary acoustic wave device can include a thermally conductive layer positioned between the interdigital transducer electrode and the piezoelectric material on one of the opposing sides of the interdigital transducer electrode.

The boundary acoustic wave device can include a dielectric layer positioned between the interdigital transducer electrode and the piezoelectric material on one of the opposing sides of the interdigital transducer electrode.

The boundary acoustic wave device can include a second interdigital transducer electrode and a thermally conductive layer. The thermally conductive layer can be positioned between the interdigital transducer electrode and the second interdigital transducer electrode.

The boundary acoustic wave device can have an electromechanical coupling coefficient in a range from 10% to 25%.

The boundary acoustic wave device can have a static capacitance in a range from 2.5 picofarads to 4 picofarads.

The two low acoustic impedance layers can include silicon dioxide.

The piezoelectric material can include lithium niobate. The piezoelectric material can include lithium tantalate.

At least one of the two high acoustic impedance substrates can be a silicon substrate. At least one of the two high acoustic impedance substrates can be a substrate that includes at least one of synthetic diamond, quartz, or spinel.

Another aspect of this disclosure is a boundary acoustic wave device that includes a first high acoustic impedance substrate, a first silicon dioxide layer over the first high acoustic impedance substrate, a first piezoelectric layer over the first silicon dioxide layer, an interdigital transducer electrode over the first piezoelectric layer, a second piezoelectric layer over the interdigital transducer electrode such that the interdigital transducer electrode is positioned between the first piezoelectric layer and the second piezoelectric layer, a second silicon dioxide layer over the second piezoelectric layer, and a second high acoustic impedance substrate over the second silicon dioxide layer. The first high acoustic impedance substrate has a higher acoustic impedance than the first silicon dioxide layer. The second high acoustic impedance substrate has a higher acoustic impedance than the second silicon dioxide layer. The boundary acoustic wave device configured to generate a boundary acoustic wave.

Another aspect of this disclosure is an acoustic wave filter that includes a boundary acoustic wave device in accordance with any suitable principles and advantages disclosed herein and a plurality of additional acoustic wave devices coupled to the boundary acoustic wave device. The boundary acoustic wave device and the plurality of additional acoustic wave devices are configured to filter a radio frequency signal.

Another aspect of this disclosure is a multiplexer that includes an acoustic wave filter in accordance with any suitable principles and advantages disclosed herein and a second filter coupled to the acoustic wave filter at a common node.

Another aspect of this disclosure is a radio frequency module that includes an acoustic wave filter in accordance with any suitable principles and advantages disclosed herein, a radio frequency circuit element coupled to the acoustic wave filter, and a packaging structure enclosing the acoustic wave filter and the radio frequency circuit element.

The radio frequency circuit element can be a switch. The radio frequency circuit element can be a radio frequency amplifier.

Another aspect of this disclosure is a wireless communication device that includes an acoustic wave filter in accordance with any suitable principles and advantages disclosed herein and an antenna operatively coupled to the acoustic wave filter. The wireless communication device can be a mobile phone, for example.

Another aspect of this disclosure is a method of radio frequency filtering. The method includes providing a radio frequency signal to an acoustic wave filter in accordance with any suitable principles and advantages disclosed herein and filtering the radio frequency signal with the acoustic wave filter.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
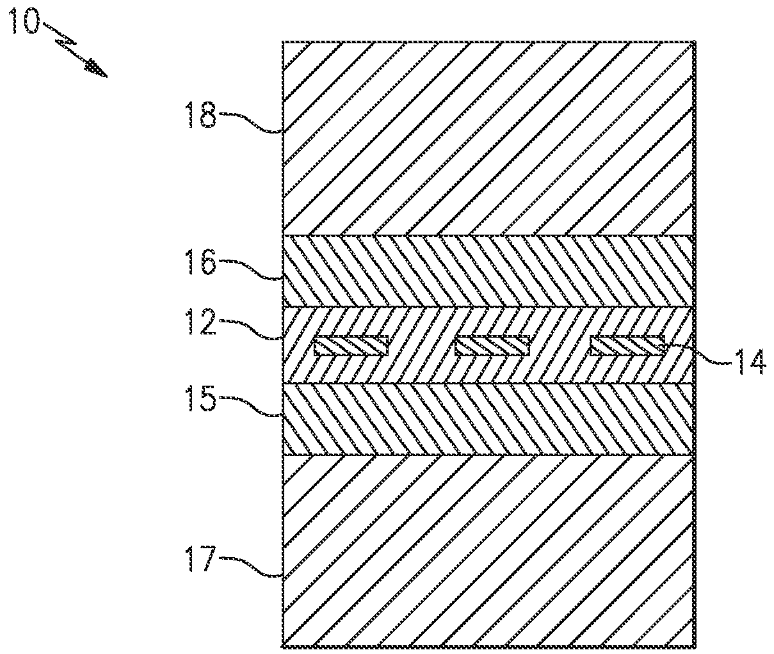
FIG. 1 illustrates a cross sectional schematic view of a boundary acoustic wave device with an interdigital transducer (IDT) electrode embedded in piezoelectric material according to an embodiment.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic wave filters can filter radio frequency (RF) signals in a variety of applications, such as in an RF front end of a mobile phone. An acoustic wave filter can be implemented with surface acoustic wave (SAW) devices. SAW devices can include an air cavity above a surface on which a surface acoustic wave propagates. The air cavity can add to the height and/or volume of SAW device chips. The size of SAW device chips contributes to the overall size of a packaged component.

Boundary acoustic wave devices can be implemented without air cavities. This can reduce package size relative to implementing SAW devices that include an air cavity. However, certain boundary acoustic wave devices have a lower electromechanical coupling coefficient $k^2$ than multilayer piezoelectric substrate (MPS) SAW devices. A lower electromechanical coupling coefficient $k^2$ can result in reduced electrical performance of an acoustic wave filter.

An acoustic wave device, such as a boundary acoustic wave device or a SAW device, can have an area that is related to a static capacitance $C_0$. With an increased static capacitance $C_0$, an acoustic wave device can be reduced in size. Reduced acoustic wave device size can lead to a decreased area of an acoustic wave chip.

Aspects of this disclosure relate to a boundary acoustic wave device that includes piezoelectric material on opposing sides of an interdigital transducer (IDT) electrode. The IDT electrode can be embedded in piezoelectric material and/or positioned between two piezoelectric layers. The piezoelectric material is positioned between two low acoustic impedance layers. The two low acoustic impedance layers are positioned between high acoustic impedance substrates. The piezoelectric material is positioned between the IDT electrode and each of the two low impedance layers.

Boundary acoustic wave devices disclosed herein can have a relatively high static capacitance $C_0$. With relatively high static capacitance $C_0$, IDT electrode size can be reduced. Accordingly, the area of the boundary acoustic wave can be reduced. Boundary acoustic wave devices disclosed herein can also achieve a relatively high electromechanical coupling coefficient $k^2$. This can improve electrical performance of an acoustic wave filter that includes such a boundary acoustic wave device. Boundary acoustic wave devices disclosed herein with relatively high electromechanical coupling coefficient $k^2$ can be implemented in acoustic wave filters with a relatively wide pass band.

Embodiments of boundary acoustic wave devices will now be discussed. Any suitable principles and advantages of the boundary acoustic wave devices disclosed herein can be implemented together with each other. For example, any suitable combination of features of the boundary acoustic wave devices of FIGS. 1-5 and 7C can be implemented together with each other.

FIG. 1 illustrates a cross sectional schematic view of a boundary acoustic wave device 10 according to an embodiment. The boundary acoustic wave device 10 can generate a boundary acoustic wave having a wavelength 2. The boundary acoustic wave device 10 can achieve a relatively high quality factor (Q), a temperature coefficient of frequency (TCF) relatively close to zero, a relatively thin stack, a relatively high electromechanical coupling coefficient $k^2$, and a relatively high electric constant Er. As illustrated, the boundary acoustic wave device 10 includes a piezoelectric layer 12, an interdigital transducer (IDT) electrode 14, low acoustic impedance layers 15 and 16, and a high acoustic impedance layers 17 and 18. The boundary acoustic wave device 10 is configured to generate a boundary acoustic wave having acoustic energy concentrated at an interface of the piezoelectric layer 12 and the IDT electrode 14.

As illustrated in FIG. 1, the IDT electrode 14 is embedded in the piezoelectric layer 12. Piezoelectric material of the piezoelectric layer 12 is positioned between the IDT electrode 14 and each of the low acoustic impedance layers 15 and 16. The IDT electrode 14 is positioned between piezoelectric material of the piezoelectric layer 12 on opposing sides in a vertical stack. The piezoelectric layer 12 can be a single crystal piezoelectric layer. For example, the piezoelectric layer can be a lithium based piezoelectric layer, such as a lithium tantalate ($LiTaO_3$) layer or a lithium niobate ($LiNbO_3$) layer. Lithium niobate and lithium tantalate are examples of piezoelectric materials that can contribute to relatively high electromechanical coupling coefficient $k^2$ for the boundary acoustic wave device 10. The piezoelectric layer 12 can have a thickness of less than the wavelength λ in certain applications. The thickness of the piezoelectric layer 12 can be less than 2λ, such as in a range from 0.1λ to 2λ, in some applications The IDT electrode 14 can generate a boundary acoustic wave at an interface with the piezoelectric layer 12. A pitch of the IDT electrode 14 can define and correspond to the wavelength λ of the boundary acoustic wave generated by the boundary acoustic wave device 10. The IDT electrode 14 can have a thickness in a range from about 0.01λ to 0.15λ. The IDT electrode 14 can include aluminum, an aluminum alloy, and/or any other suitable material for an IDT electrode 14. For example, IDT electrode material can include aluminum (Al), titanium (Ti), gold (Au), silver (Ag), copper (Cu), platinum (Pt), tungsten (W), molybdenum (Mo), ruthenium (Ru), or any suitable combination thereof. IDT electrode thickness can be relatively thinner when relatively heavy electrodes, such as Au, Ag, Cu, Pt, W, Mo, or Ru, are used. In some applications, the IDT electrode can include two or more metal layers.

The low acoustic impedance layer 15 is positioned between the piezoelectric layer 12 and the first high acoustic impedance substrate 17. The low acoustic impedance layer 15 can have a lower bulk velocity than a velocity of the acoustic wave generated by the IDT electrode 14. The low acoustic impedance layer 15 can have a lower acoustic impedance than the high impedance substrate 17. The low acoustic impedance layer 15 can have a lower acoustic impedance than the piezoelectric layer 12.

As illustrated, the low acoustic impedance layer 15 has a first side in physical contact with the piezoelectric layer 12 and a second side in physical contact with the first high acoustic impedance substrate 17. The low acoustic impedance layer 15 can be a dielectric layer. The low acoustic impedance layer 15 can be a silicon dioxide ($SiO_2$) layer. The low acoustic impedance layer 15 can have a thickness of less than 12 in certain applications. The thickness of the low acoustic impedance layer 15 can be in a range from about 0.05λ to 1.0λ. In some of these instances, the thickness of the low acoustic impedance layer 15 can be less than 0.5λ.

The low acoustic impedance layer 15 can bring the temperature coefficient of frequency (TCF) of the boundary acoustic wave device 10 closer to zero than to a similar acoustic wave device without the low acoustic impedance layer 15. The low acoustic impedance layer 15 can have a positive temperature coefficient of frequency. In certain applications, the low acoustic impedance layer 15 can improve an electromechanical coupling coefficient $k^2$ of the boundary acoustic wave device 10.

The first high acoustic impedance substrate 17 has a higher bulk velocity than a velocity of the boundary acoustic wave generated by the IDT electrode 14. The first high acoustic impedance substrate 17 is a high acoustic impedance layer. The first high acoustic impedance substrate 17 has a higher acoustic impedance than the piezoelectric layer 12. The first high acoustic impedance substrate 17 has a higher acoustic impedance than the low acoustic velocity layer 15. The first high acoustic impedance substrate 17 can inhibit an acoustic wave generated by the boundary acoustic wave device 10 from leaking out of the boundary acoustic wave device 10. The first high acoustic impedance substrate 17 can be a silicon substrate. Such a silicon substrate can have a relatively high acoustic velocity, a relatively large stiffness, and a relatively small density. The silicon substrate can be a polycrystalline silicon substrate in certain instances. In some other instances, the first high acoustic impedance substrate 17 can be implemented by other suitable material having a higher acoustic velocity than the velocity of the acoustic wave generated by the IDT electrode 14 of the boundary acoustic wave device 10. For instance, the first high acoustic impedance substrate 17 can include silicon nitride, aluminum nitride, diamond such as synthetic diamond, quartz, spinel, the like, or any suitable combination thereof. The first high impedance substrate 17 can be a support substrate. As illustrated, the first high impedance substrate 17 can be an outermost layer in a stack of the boundary acoustic wave device 10.

A second acoustic low impedance layer 16 is positioned between the piezoelectric layer 12 and the second high acoustic impedance substrate 18. The second low acoustic impedance layer 16 can be implemented in accordance with any suitable principles and advantages discussed with reference to the low acoustic impedance layer 15.

For example, the second low acoustic impedance layer 16 can perform a similar function as the first low acoustic impedance layer 15. In certain instances, the second low acoustic impedance layer 16 can be the same material as the first low acoustic impedance layer 15. The second low acoustic impedance layer 16 can be formed of a different material than the first low acoustic impedance layer 15 in some instances.

The second high acoustic impedance substrate 18 can be implemented in accordance with any suitable principles and advantages discussed with reference to the first high acoustic impedance substrate 17. For example, the second high acoustic impedance substrate 18 can perform a similar function as the first high acoustic impedance substrate 17. The second high acoustic impedance substrate 18 is a high acoustic impedance layer. As illustrated, the second high impedance substrate 18 can be an outermost layer in a stack of the boundary acoustic wave device 10. In certain instances, the second high acoustic impedance substrate 18 can be the same material as the first high acoustic impedance substrate 17. The second high acoustic impedance substrate 18 can be formed of a different material than the first high acoustic impedance substrate 17 in some instances. A vertical stack of the boundary acoustic wave device 10 can be symmetric about the IDT electrode 14 in certain applications.

Figure 2:
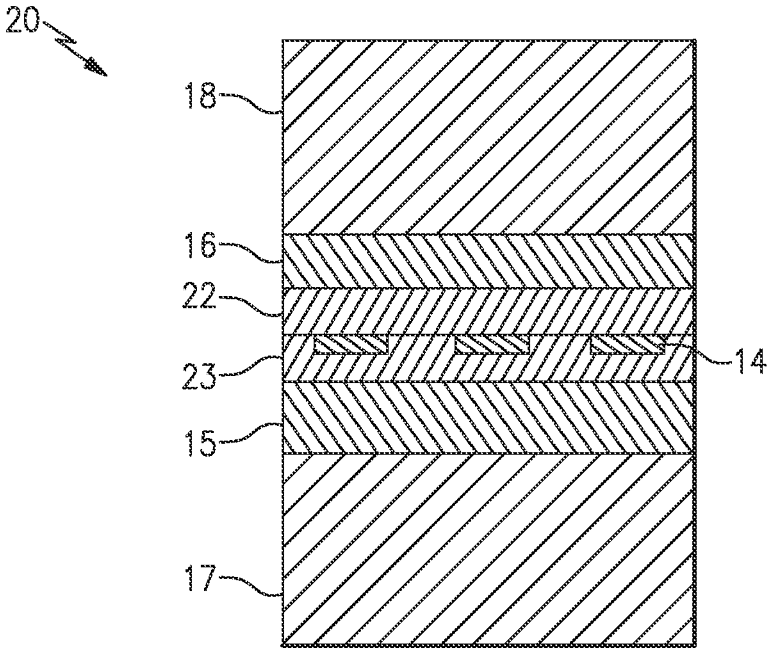
FIG. 2 illustrates a cross sectional schematic view of a boundary acoustic wave device with an IDT electrode embedded in piezoelectric material and bonded to a layer of the piezoelectric material according to an embodiment.

FIG. 2 illustrates a cross sectional schematic view of a boundary acoustic wave device 20 with an IDT electrode 14 embedded in piezoelectric material and bonded to a layer 22 of the piezoelectric material according to an embodiment. The boundary acoustic wave device 20 is like the acoustic wave device 10 of FIG. 1, except that the IDT electrode 14 is bonded to the first piezoelectric layer 22 and embedded in piezoelectric material of the first piezoelectric layer 22 and a second piezoelectric layer 23. The IDT electrode 14 is positioned between the first piezoelectric layer 22 and the second piezoelectric layer 23. Piezoelectric material of the piezoelectric layer 12 is positioned between the IDT electrode 14 and each of the low acoustic impedance layers 15 and 16. In the boundary acoustic wave device 20, the IDT electrode 14 is positioned between piezoelectric material on opposing sides in a vertical stack. The piezoelectric layers 22 and 23 can be implemented in accordance with any suitable principles and advantages disclosed with reference to the piezoelectric layer 12 of FIG. 1. Piezoelectric material of the piezoelectric layer 22 and 23 is positioned between the IDT electrode 14 and the low acoustic impedance layers 16 and 15, respectively. The boundary acoustic wave device 20 can be manufactured with a different manufacturing process than the boundary acoustic wave device 10. During manufacture, the piezoelectric layers 22 and 23 can be bonded to each other.

Figure 3:
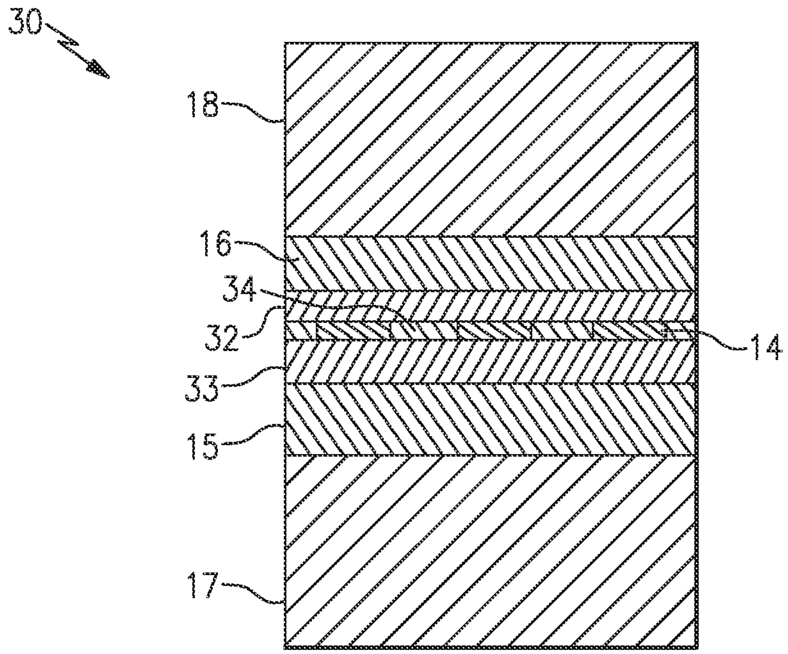
FIG. 3 illustrates a cross sectional schematic view of a boundary acoustic wave device with an IDT electrode positioned between piezoelectric layers according to an embodiment.

FIG. 3 illustrates a cross sectional schematic view of a boundary acoustic wave device 30 with an IDT electrode 14 positioned between piezoelectric layers 32 and 33 according to an embodiment. In the boundary acoustic wave device 30, piezoelectric layers 32 and 33 are in physical contact with the IDT electrode 14 on opposing sides. The piezoelectric layers 32 and 33 can be implemented in accordance with any suitable principles and advantages disclosed with reference to the piezoelectric layer 12 of FIG. 1. Dielectric material 34 is located between interdigital transducer electrode fingers of the IDT electrode 14 of the boundary acoustic wave device 30. The dielectric material 34 can be the same material as the low acoustic impedance layer(s) 15 and/or 16 in certain applications. The dielectric material 34 can be silicon dioxide, for example. A vertical stack of the boundary acoustic wave device 30 can be symmetric about the IDT electrode 14 in certain applications.

Figure 4:
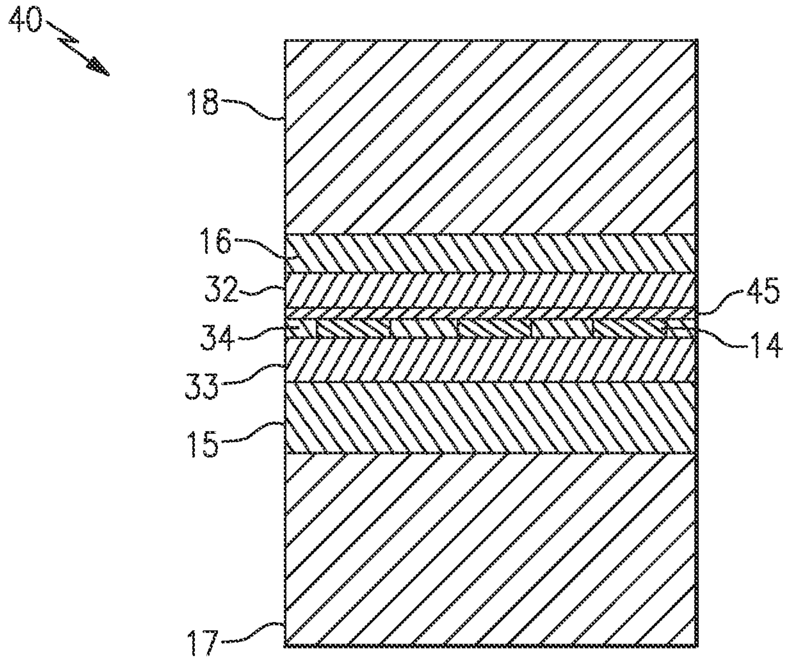
FIG. 4 illustrates a cross sectional schematic view of a boundary acoustic wave device with an IDT electrode positioned between piezoelectric layers where a thermally conductive layer is positioned between the IDT electrode and one of the piezoelectric layers according to an embodiment.

FIG. 4 illustrates a cross sectional schematic view of a boundary acoustic wave device 40 with an IDT electrode 14 positioned between piezoelectric layers 32 and 33 according to an embodiment. The boundary acoustic wave device 40 is like the acoustic wave device 30 of FIG. 3, except that a thermally conductive layer 45 is positioned between the IDT electrode 14 and the piezoelectric layer 33. The thermally conductive layer 45 can serve as an etch stop layer for an etch stop process. Accordingly, the thermally conductive layer 45 can alternatively be referred to as an etch stop layer in such applications. There can be manufacturing advantages with the thermally conductive layer 45 for an etch stop process in certain applications. The thermally conductive layer 45 can be a silicon nitride (SiN) layer, a nitride, or a layer that includes silicon. The thermally conductive layer 45 can be a dielectric layer. The thermally conductive layer 45 can increase heat dissipation in the boundary acoustic wave device 40 relative to the boundary acoustic wave device 30.

Figure 5:
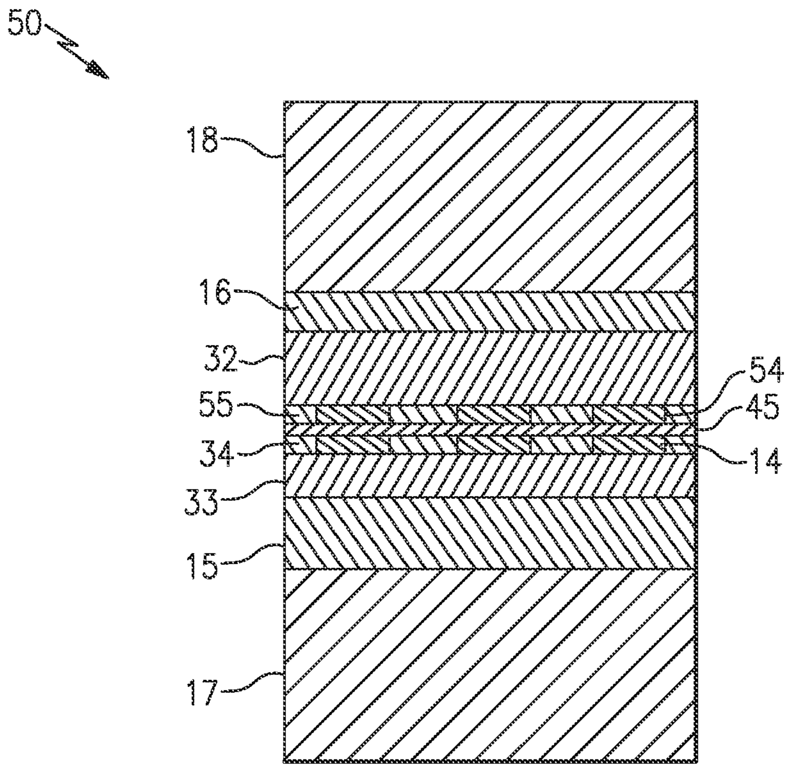
FIG. 5 illustrates a cross sectional schematic view of a boundary acoustic wave device with IDT electrodes positioned between piezoelectric layers where a thermally conductive layer is positioned between the IDT electrodes according to an embodiment.

FIG. 5 illustrates a cross sectional schematic view of a boundary acoustic wave device 50 with IDT electrodes 14 and 54 positioned between piezoelectric layers 32 and 33 according to an embodiment. A thermally conductive layer 45 is positioned between the IDT electrodes 14 and 54 in the boundary acoustic wave device 50. Dielectric material 55 is positioned between interdigital transducer electrode fingers of the IDT 54. The IDT electrodes 14 and 54 can be connected via a busbar.

Figure 6A:
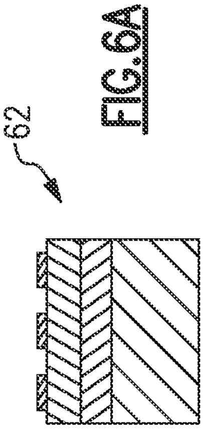
FIG. 6A is a cross sectional schematic diagram of a multilayer piezoelectric substrate surface acoustic wave device.
Figure 6B:
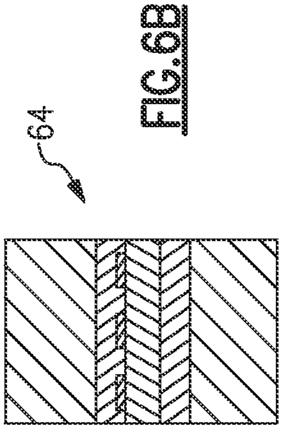
FIG. 6B is a cross sectional schematic diagram of a boundary acoustic wave device.
Figure 6C:
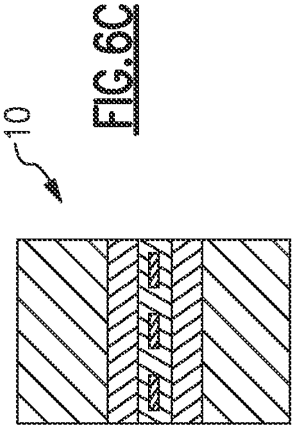
FIG. 6C is a cross sectional schematic diagram of a boundary acoustic wave device according to an embodiment.

FIG. 6A is a cross sectional schematic diagram of a multilayer piezoelectric substrate (MPS) surface acoustic wave (SAW) device 62. The MPS SAW device 62 includes an IDT electrode over a low acoustic impedance layer over a high acoustic impedance substrate. The FIG. 6B is a cross sectional schematic diagram of a boundary acoustic wave device 64. The boundary acoustic wave device 64 is a boundary MPS structure. FIG. 6C is a cross sectional schematic diagram of the boundary acoustic wave device 10.

Figure 6D:
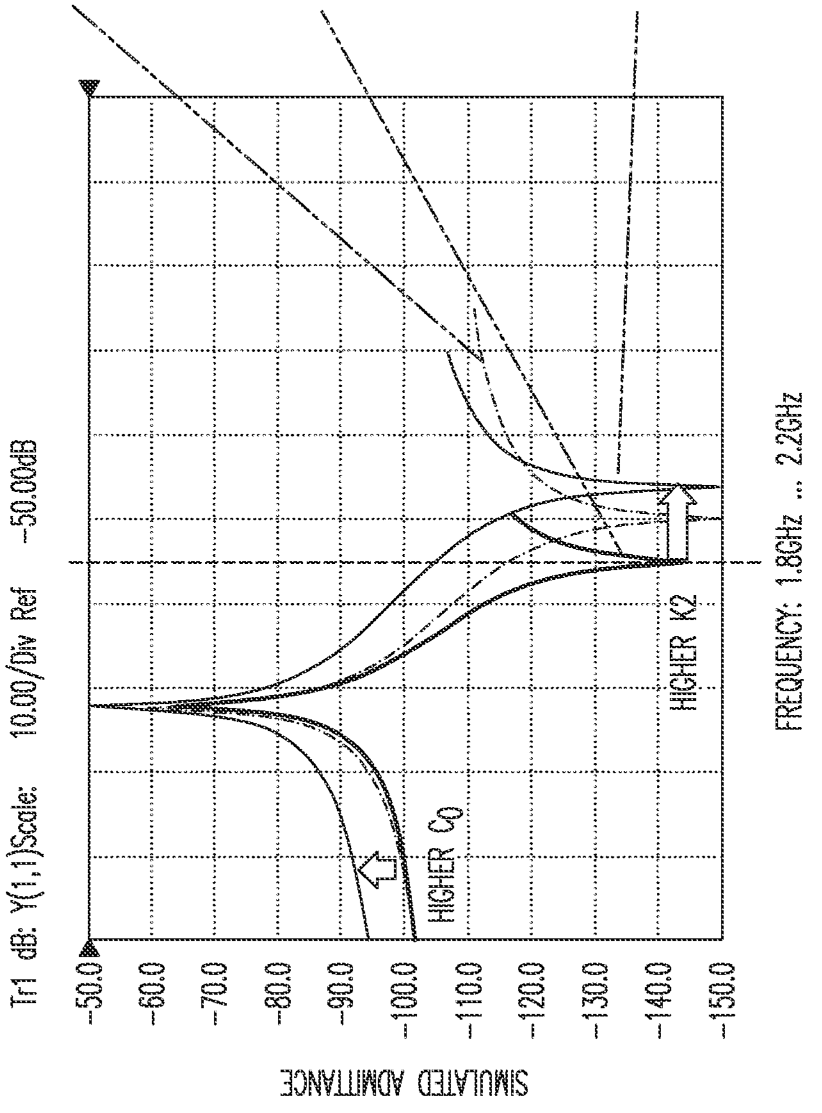
FIG. 6D is a graph of simulated admittance over frequency for the acoustic wave devices of FIGS. 6A, 6B, and 6C.

FIG. 6D is a graph of simulated admittance over frequency for the acoustic wave devices of FIGS. 6A, 6B, and 6C. The graph indicates a $k^2$ of 10.4% and $C_0$ of 1.64 picofarad (pF) for the MPS SAW device 62. The graph indicates a $k^2$ of 7.8% and $C_0$ of 1.73 pF for the boundary acoustic wave device 64. Accordingly, the boundary acoustic wave device 64 has degraded $k^2$ relative to the MPS SAW device 62. The graph indicates a $k^2$ of 11.3% and $C_0$ of 3.37 pF for the boundary acoustic wave device 10. Accordingly, the boundary acoustic wave device 10 has a higher $k^2$ than the acoustic wave devices 62 and 64. The boundary acoustic wave device 10 also has a higher static capacitance $C_0$ than the acoustic wave devices 62 and 64.

Boundary acoustic wave devices according to embodiments disclosed herein can have a $k^2$ in a range from 10% to 25% in certain applications. For example, boundary acoustic wave devices according to embodiments disclosed herein with a lithium tantalate piezoelectric layer can have a $k^2$ in a range from 10% to 13%. As another example, boundary acoustic wave devices according to embodiments disclosed herein with a lithium niobate piezoelectric layer can have a $k^2$ in a range from 19% to 25%. Higher $k^2$ can result in better electrical performance.

At the same time, the boundary acoustic wave device 10 can achieve a significant increase in static capacitance $C_0$ relative to the acoustic wave devices 62 and 64. Boundary acoustic wave devices according to embodiments disclosed herein can have a static capacitance $C_0$ in a range from 2.5 pF to 5 pF in certain applications. Boundary acoustic wave devices according to embodiments disclosed herein can have a static capacitance $C_0$ in a range from 2.5 pF to 4 pF in some applications. The increased static capacitance $C_0$ can enable a corresponding IDT electrode size reduction. Accordingly, the boundary acoustic wave device 10 can be significantly smaller in physical area than the acoustic wave devices 62 and 64. The boundary acoustic wave device 10 has a static capacitance $C_0$ that is roughly double the static capacitance $C_0$ of the boundary acoustic wave device 62 or 64. Area can be proportional to static capacitance $C_0$. Accordingly, the area of the boundary acoustic wave device 10 can be roughly half of the area of the boundary acoustic wave device 62 or 64.

Without being bound by theory, an explanation of the improved $k^2$ and $C_0$ of the boundary acoustic wave device is provided. The $k^2$ can be determined based on the electric field in the piezoelectric layer. In the boundary acoustic wave device 10, the IDT electrode can apply an electric field to the piezoelectric layer on opposing sides, resulting in a larger electric field in the piezoelectric layer. This can increase $k^2$ relative to an IDT driving an electric field into a piezoelectric layer on one size in the acoustic wave devices of FIGS. 6A and 6B. Higher Er and $C_0$ can also result from the IDT electrode applying an electric field to the piezoelectric layer on opposing sides.

Figures 7A, 7B, 7C, 7D, 7E:
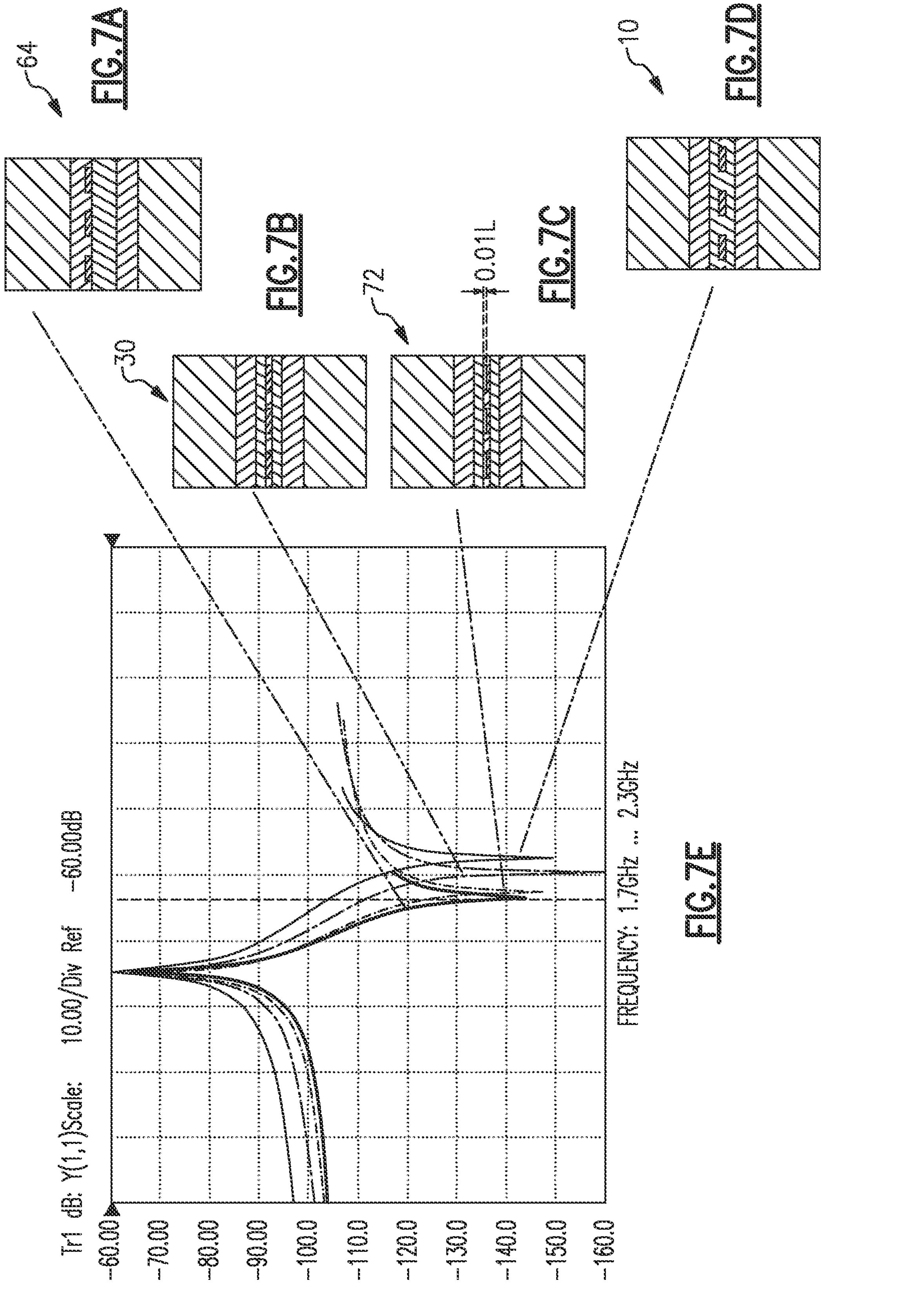
FIGS. 7A, 7B, 7C, and 7D are a cross sectional schematic diagrams boundary acoustic wave devices.
FIG. 7E is a graph of simulated admittance over frequency for the boundary acoustic wave devices of FIGS. 7A, 7B, 7C, and 7D.

FIGS. 7A, 7B, 7C, and 7D are a cross sectional schematic diagrams boundary acoustic wave devices. The boundary acoustic wave device 64 is illustrated in FIG. 7A, the boundary acoustic wave device 30 is illustrated in FIG. 7B, and the boundary acoustic wave device 10 is illustrated in FIG. 7D. A boundary acoustic device 72 shown in FIG. 7C is like the boundary acoustic wave device 30, except that the IDT electrode is spaced apart from one of the piezoelectric layers by dielectric material. As shown in FIG. 7C, the spacing between the IDT electrode and the one piezoelectric layer was 0.01λ for the corresponding simulation in FIG. 7E, where λ is the wavelength of the boundary acoustic wave generated by the boundary acoustic wave device 72.

FIG. 7E is a graph of simulated admittance over frequency for the boundary acoustic wave devices of FIGS. 7A, 7B, 7C, and 7D. This graph indicates that both $k^2$ and $C_0$ of each of the boundary acoustic wave devices 30, 72, and 10 are higher than $k^2$ and $C_0$ of the boundary acoustic wave device 64. Accordingly, having piezoelectric material on opposing sides of an IDT electrode in a stack can increase $k^2$ and $C_0$ of a boundary acoustic wave device relative to having piezoelectric material on only one side of the IDT electrode. FIG. 7E indicates that the boundary acoustic wave device 10 with an IDT electrode embedded in piezoelectric material has the highest $k^2$ and the highest $C_0$ of the simulated boundary acoustic wave devices of FIGS. 7A to 7D.

Boundary acoustic wave devices disclosed herein can be implemented as boundary acoustic wave resonators in in acoustic wave filters. Such filters can be arranged to filter a radio frequency signal. In certain applications, the acoustic wave filters can be band pass filters arranged to pass a radio frequency band and attenuate frequencies outside of the radio frequency band. Acoustic wave filters can implement band rejection filters. Boundary acoustic wave devices disclosed herein can be implemented in a variety of different filter topologies. Example filter topologies include a ladder filter, a lattice filter, and a hybrid ladder lattice filter, and the like. An acoustic wave filter can include all boundary acoustic wave resonators. An acoustic wave filter can include one or more boundary acoustic wave resonators and one or more other types of acoustic wave resonators such as a SAW resonator and/or a BAW resonator. Boundary acoustic wave resonators disclosed herein can be implemented in a filter that includes at least one boundary acoustic wave resonator and a non-acoustic inductor-capacitor component. Some example filter topologies will now be discussed with reference to FIGS. 8 to 10. Any suitable combination of features of the filter topologies of FIGS. 8 to 10 can be implemented together with each other and/or with other filter topologies.

Figure 8:
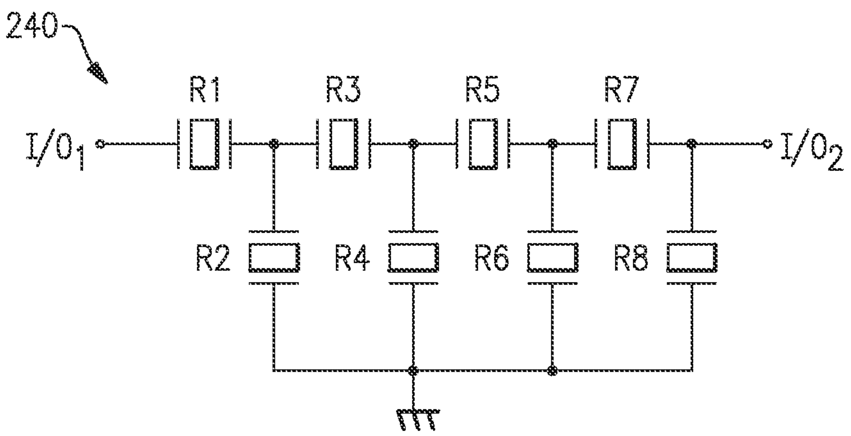
FIG. 8 is a schematic diagram of a ladder filter that includes a boundary acoustic wave resonator according to an embodiment.

FIG. 8 is a schematic diagram of a ladder filter 240 that includes a boundary acoustic wave resonator according to an embodiment. The ladder filter 240 is an example topology that can implement a band pass filter formed from acoustic wave resonators. In a band pass filter with a ladder filter topology, the shunt resonators can have lower resonant frequencies than the series resonators. The ladder filter 240 can be arranged to filter a radio frequency signal. As illustrated, the ladder filter 240 includes series acoustic wave resonators R1, R3, R5, and R7 and shunt acoustic wave resonators R2, R4, R6, and R8 coupled between a first input/output port $I/O_1$ and a second input/output port $I/O_2$. Any suitable number of series acoustic wave resonators can be in included in a ladder filter. Any suitable number of shunt acoustic wave resonators can be included in a ladder filter. The first input/output port $I/O_1$ can a transmit port and the second input/output port $I/O_2$ can be an antenna port. Alternatively, first input/output port $I/O_1$ can be a receive port and the second input/output port $I/O_2$ can be an antenna port.

One or more of the acoustic wave resonators of the ladder filter 240 can include a boundary acoustic wave resonator according to an embodiment. For example, some or all of the acoustic wave resonators R1 to R8 can include a stack with piezoelectric material on opposing sides of an IDT electrode. Such acoustic wave resonator(s) can have a high $k^2$ and $C_0$.

Figure 9:
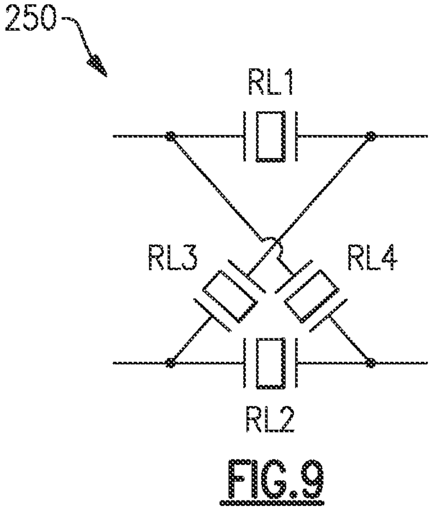
FIG. 9 is a schematic diagram of a lattice filter that includes a boundary acoustic wave resonator according to an embodiment.

FIG. 9 is a schematic diagram of a lattice filter 250 that includes a boundary acoustic wave resonator according to an embodiment. The lattice filter 250 is an example topology that can form a band pass filter from acoustic wave resonators. The lattice filter 250 can be arranged to filter an RF signal. As illustrated, the lattice filter 250 includes acoustic wave resonators RL1, RL2, RL3, and RL4. The acoustic wave resonators RL1 and RL2 are series resonators. The acoustic wave resonators RL3 and RL4 are shunt resonators. The illustrated lattice filter 250 has a balanced input and a balanced output. One or more of the illustrated acoustic wave resonators RL1 to RL4 can be a boundary acoustic wave resonator in accordance with any suitable principles and advantages disclosed herein.

Figure 10:
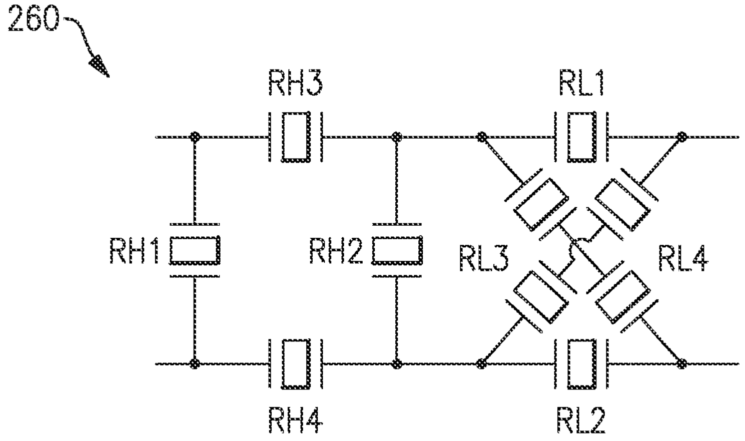
FIG. 10 is a schematic diagram of a hybrid ladder lattice filter that includes a boundary acoustic wave resonator according to an embodiment.

FIG. 10 is a schematic diagram of a hybrid ladder and lattice filter 260 that includes a boundary acoustic wave resonator according to an embodiment. The illustrated hybrid ladder and lattice filter 260 includes series acoustic resonators RL1, RL2, RH3, and RH4 and shunt acoustic resonators RL3, RL4, RH1, and RH2. The hybrid ladder and lattice filter 260 includes one or more boundary acoustic wave resonators in accordance with any suitable principles and advantages disclosed herein.

In some applications, a boundary acoustic wave resonator can be included in filter that also includes one or more inductors and one or more capacitors.

The principles and advantages disclosed herein can be implemented in a standalone filter and/or in one or more filters in any suitable multiplexer. Such filters can be any suitable topology discussed herein, such as any filter topology in accordance with any suitable principles and advantages disclosed with reference to FIG. 8. The filter can be a band pass filter arranged to filter a fourth generation (4G) Long Term Evolution (LTE) band and/or a fifth generation (5G) New Radio (NR) band. Examples of a standalone filter and multiplexers will be discussed with reference to FIGS. 11A to 11E. Any suitable principles and advantages of these filters and/or multiplexers can be implemented together with each other. Moreover, the boundary acoustic wave resonators disclosed herein can be included in filter that also includes one or more inductors and one or more capacitors.

Figure 11A:
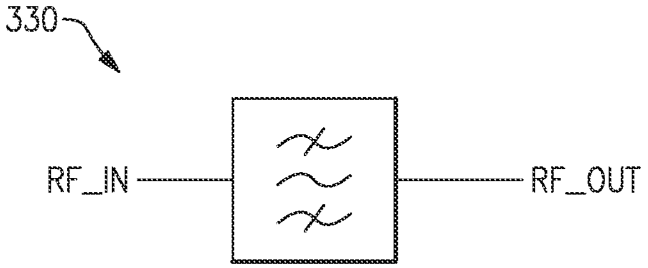
FIG. 11A is schematic diagram of an acoustic wave filter.

FIG. 11A is schematic diagram of an acoustic wave filter 330. The acoustic wave filter 330 is a band pass filter. The acoustic wave filter 330 is arranged to filter a radio frequency signal. The acoustic wave filter 330 includes a plurality of acoustic wave resonators coupled between a first input/output port RF_IN and a second input/output port RF_OUT. The acoustic wave filter 330 includes one or more boundary acoustic wave resonators implemented in accordance with any suitable principles and advantages disclosed herein.

Figure 11B:
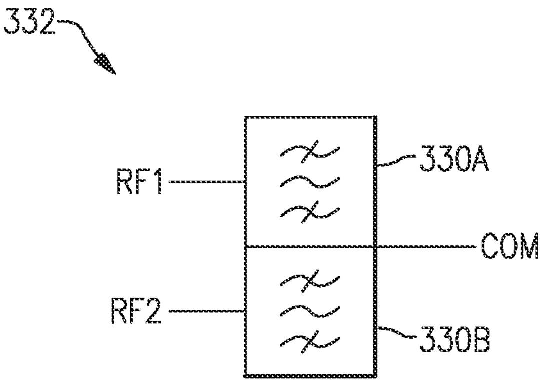
FIG. 11B is a schematic diagram of a duplexer that includes a boundary acoustic wave device according to an embodiment.

FIG. 11B is a schematic diagram of a duplexer 332 that includes an acoustic wave filter according to an embodiment. The duplexer 332 includes a first filter 330A and a second filter 330B coupled to together at a common node COM. One of the filters of the duplexer 332 can be a transmit filter and the other of the filters of the duplexer 332 can be a receive filter. In some other instances, such as in a diversity receive application, the duplexer 332 can include two receive filters. Alternatively, the duplexer 332 can include two transmit filters. The common node COM can be an antenna node.

The first filter 330A is an acoustic wave filter arranged to filter a radio frequency signal. The first filter 330A includes acoustic wave resonators coupled between a first radio frequency node RF1 and the common node COM. The first radio frequency node RF1 can be a transmit node or a receive node. The first filter 330A includes one or more boundary acoustic wave resonators implemented in accordance with any suitable principles and advantages disclosed herein.

The second filter 330B can be any suitable filter arranged to filter a second radio frequency signal. The second filter 330B can be, for example, an acoustic wave filter, an acoustic wave filter that includes one or more boundary acoustic wave resonators in accordance with any suitable principles and advantages disclosed herein, an LC filter, a hybrid acoustic wave LC filter, or the like. The second filter 330B is coupled between a second radio frequency node RF2 and the common node. The second radio frequency node RF2 can be a transmit node or a receive node.

Although example embodiments may be discussed with filters or duplexers for illustrative purposes, any suitable principles and advantages disclosed herein can be implemented in a multiplexer that includes a plurality of filters coupled together at a common node. Examples of multiplexers include but are not limited to a duplexer with two filters coupled together at a common node, a triplexer with three filters coupled together at a common node, a quadplexer with four filters coupled together at a common node, a hexaplexer with six filters coupled together at a common node, an octoplexer with eight filters coupled together at a common node, or the like. Multiplexers can include filters having different passbands. Multiplexers can include any suitable number of transmit filters and any suitable number of receive filters. For example, a multiplexer can include all receive filters, all transmit filters, or one or more transmit filters and one or more receive filters. One or more filters of a multiplexer can include any suitable number of boundary acoustic wave resonators in accordance with any suitable principles and advantages disclosed herein.

Figure 11C:
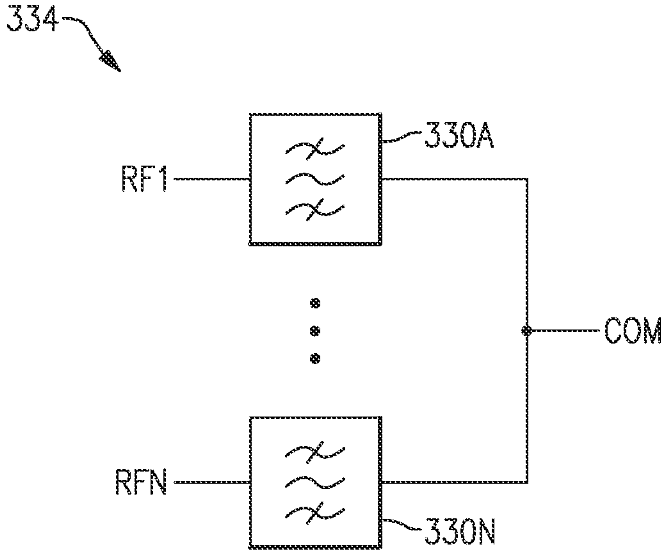
FIG. 11C is a schematic diagram of a multiplexer that includes a boundary acoustic wave device according to an embodiment.

FIG. 11C is a schematic diagram of a multiplexer 334 that includes an acoustic wave filter according to an embodiment. The multiplexer 334 includes a plurality of filters 330A to 330N coupled together at a common node COM. The plurality of filters can include any suitable number of filters including, for example, 3 filters, 4 filters, 5 filters, 6 filters, 7 filters, 8 filters, or more filters. Some or all of the plurality of acoustic wave filters can be acoustic wave filters. As illustrated, the filters 330A to 330N each have a fixed electrical connection to the common node COM. This can be referred to as hard multiplexing or fixed multiplexing. Filters have fixed electrical connections to the common node in hard multiplexing applications. Each of the filters 330A to 330N has a respective input/output node RF1 to RFN.

The first filter 330A is an acoustic wave filter arranged to filter a radio frequency signal. The first filter 330A can include one or more acoustic wave devices coupled between a first radio frequency node RF1 and the common node COM. The first radio frequency node RF1 can be a transmit node or a receive node. The first filter 330A includes one or more boundary acoustic wave resonators in accordance with any suitable principles and advantages disclosed herein. The other filter(s) of the multiplexer 334 can include one or more acoustic wave filters, one or more acoustic wave filters that include one or more boundary acoustic wave resonators in accordance with any suitable principles and advantages disclosed herein, one or more LC filters, one or more hybrid acoustic wave LC filters, or any suitable combination thereof.

Figure 11D:
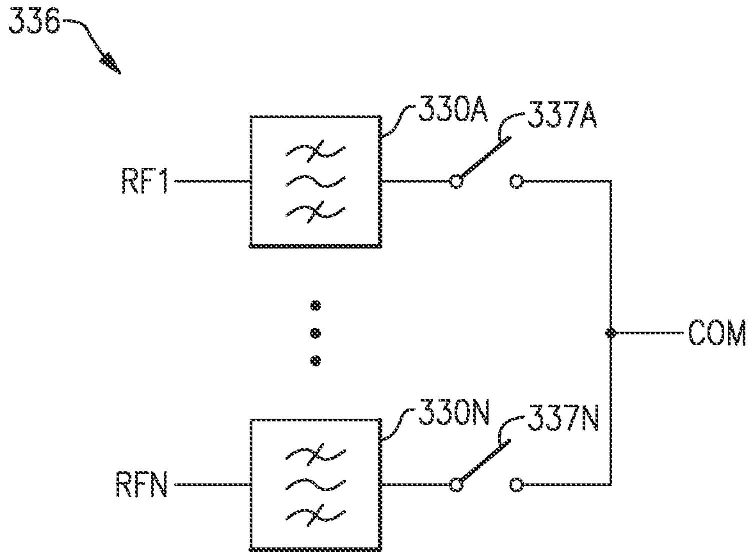
FIG. 11D is a schematic diagram of a multiplexer that includes a boundary acoustic wave device according to an embodiment.

FIG. 11D is a schematic diagram of a multiplexer 336 that includes an acoustic wave filter according to an embodiment. The multiplexer 336 is like the multiplexer 334 of FIG. 11C, except that the multiplexer 336 implements switched multiplexing. In switched multiplexing, a filter is coupled to a common node via a switch. In the multiplexer 336, the switches 337A to 337N can selectively electrically connect respective filters 330A to 330N to the common node COM. For example, the switch 337A can selectively electrically connect the first filter 330A to the common node COM via the switch 337A. Any suitable number of the switches 337A to 337N can electrically a respective filters 330A to 330N to the common node COM in a given state. Similarly, any suitable number of the switches 337A to 337N can electrically isolate a respective filter 330A to 330N to the common node COM in a given state. The functionality of the switches 337A to 337N can support various carrier aggregations.

Figure 11E:
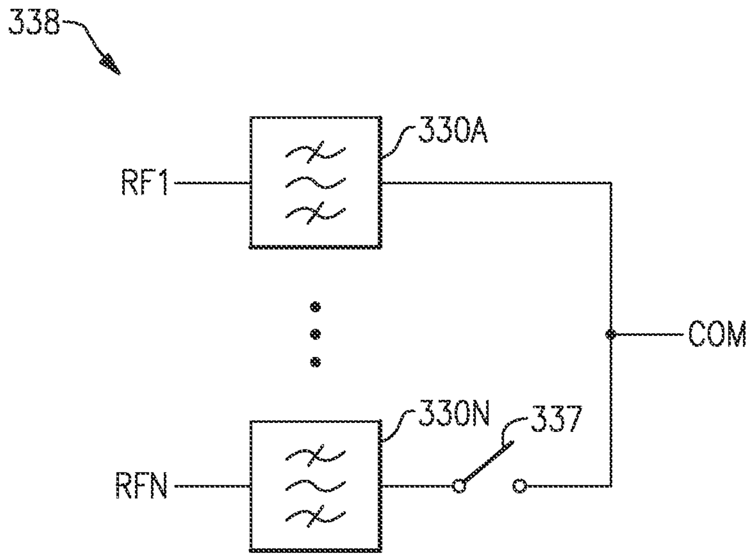
FIG. 11E is a schematic diagram of a multiplexer that includes a boundary acoustic wave device according to an embodiment.

FIG. 11E is a schematic diagram of a multiplexer 338 that includes an acoustic wave filter according to an embodiment. The multiplexer 338 illustrates that a multiplexer can include any suitable combination of hard multiplexed and switched multiplexed filters. One or more boundary acoustic wave resonators in accordance with any suitable principles and advantages disclosed herein can be included in a filter that is hard multiplexed to the common node of a multiplexer. Alternatively or additionally, one or more boundary acoustic wave resonators in accordance with any suitable principles and advantages disclosed herein can be included in a filter that is switch multiplexed to the common node of a multiplexer.

Boundary acoustic wave resonators disclosed herein can be implemented in a variety of packaged modules. Some example packaged modules will now be discussed in which any suitable principles and advantages of the boundary acoustic wave resonators devices disclosed herein can be implemented. Example packaged modules include one or more acoustic wave filters and one or more radio frequency amplifiers (e.g., one or more power amplifiers and/or one or more low noise amplifiers) and/or one or more radio frequency switches. The example packaged modules can include a package that encloses the illustrated circuit elements. The illustrated circuit elements can be disposed on a common packaging substrate. The packaging substrate can be a laminate substrate, for example. FIGS. 12 to 16 are schematic block diagrams of illustrative packaged modules according to certain embodiments. Any suitable combination of features of these packaged modules can be implemented with each other. While duplexers are illustrated in the example packaged modules of FIGS. 13 to 16, any other suitable multiplexer that includes a plurality of filters coupled to a common node can be implemented instead of one or more duplexers. For example, a quadplexer can be implemented in certain applications. Alternatively or additionally, one or more filters of a packaged module can be arranged as a transmit filter or a receive filter that is not included in a multiplexer.

Figure 12:
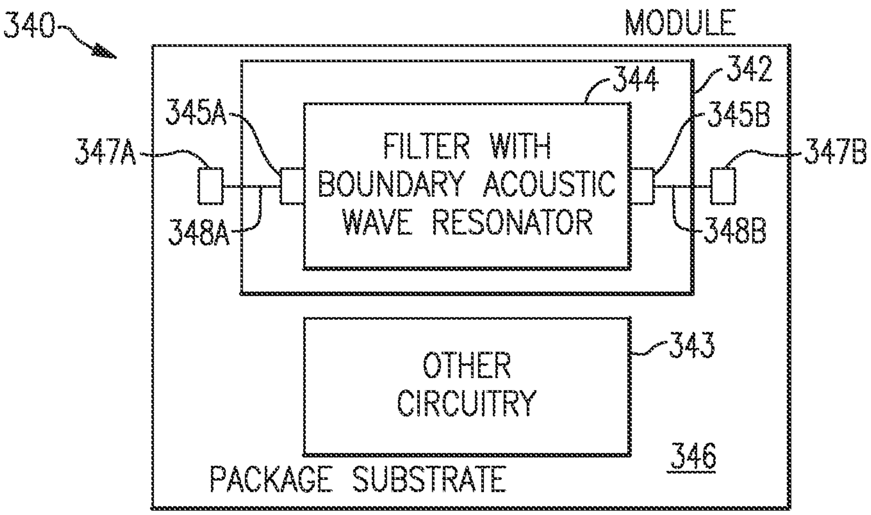
FIGS. 12, 13, 14, 15, and 16 are schematic block diagrams of illustrative packaged modules according to certain embodiments.

FIG. 12 is a schematic diagram of a radio frequency module 340 that includes an acoustic wave component 342 according to an embodiment. The illustrated radio frequency module 340 includes the acoustic wave component 342 and other circuitry 343. The acoustic wave component 342 can include one or more boundary acoustic wave resonators in accordance with any suitable combination of features disclosed herein. The acoustic wave component 342 can include a boundary acoustic wave die that includes boundary acoustic wave resonators.

The acoustic wave component 342 shown in FIG. 12 includes a filter 344 and terminals 345A and 345B. The filter 344 includes one or more boundary acoustic wave resonators implemented in accordance with any suitable principles and advantages disclosed herein. The terminals 345A and 344B can serve, for example, as an input contact and an output contact. The acoustic wave component 342 and the other circuitry 343 are on a common packaging substrate 346 in FIG. 12. The packaging substrate 346 can be a laminate substrate. The terminals 345A and 345B can be electrically connected to contacts 347A and 347B, respectively, on the packaging substrate 346 by way of electrical connectors 348A and 348B, respectively. The electrical connectors 348A and 348B can be bumps or wire bonds, for example.

The other circuitry 343 can include any suitable additional circuitry. For example, the other circuitry can include one or more radio frequency amplifiers (e.g., one or more power amplifiers and/or one or more low noise amplifiers), one or more power amplifiers, one or more radio frequency switches, one or more additional filters, one or more low noise amplifiers, one or more RF couplers, one or more delay lines, one or more phase shifters, the like, or any suitable combination thereof. The other circuitry 343 can be electrically connected to the filter 344. The radio frequency module 340 can include one or more packaging structures to, for example, provide protection and/or facilitate easier handling of the radio frequency module 340. Such a packaging structure can include an overmold structure formed over the packaging substrate 346. The overmold structure can encapsulate some or all of the components of the radio frequency module 340.

Figure 13:
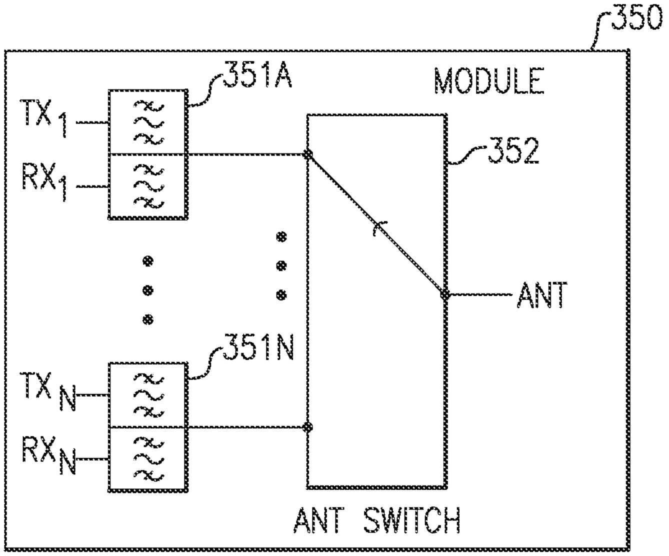

FIG. 13 is a schematic block diagram of a module 350 that includes multiplexers 351A to 351N and an antenna switch 352. The multiplexers 351A to 351N illustrated in FIG. 13 are duplexers One or more filters of the multiplexers 351A to 351N can include one or more boundary acoustic wave resonators in accordance with any suitable principles and advantages discussed herein. Any suitable number of multiplexers 351A to 351N can be implemented. The antenna switch 352 can have a number of throws corresponding to the number of multiplexers 351A to 351N. The antenna switch 352 can include one or more additional throws coupled to one or more filters external to the module 350 and/or coupled to other circuitry. The antenna switch 352 can electrically couple a selected multiplexer to an antenna port of the module 350.

Figure 14:
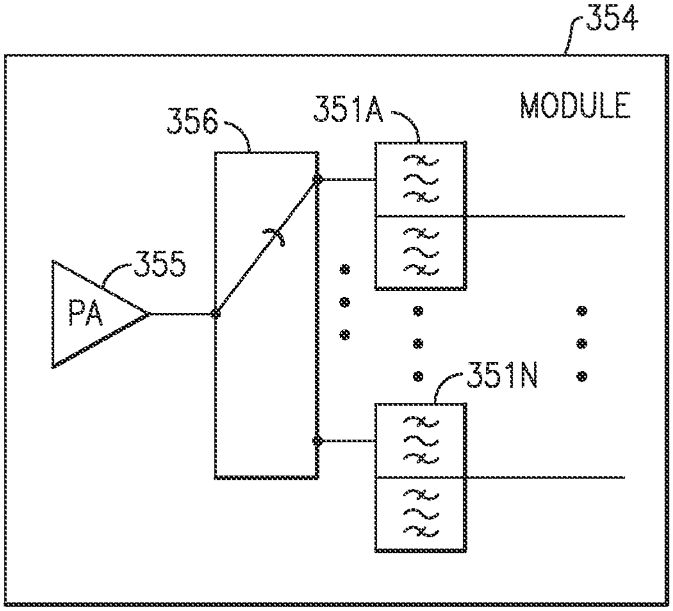

FIG. 14 is a schematic block diagram of a module 354 that includes a power amplifier 355, a radio frequency switch 356, and multiplexers 351A to 351N in accordance with one or more embodiments. The power amplifier 355 can amplify a radio frequency signal. The radio frequency switch 356 can be a multi-throw radio frequency switch. The radio frequency switch 356 can electrically couple an output of the power amplifier 355 to a selected transmit filter of the multiplexers 351A to 351N. One or more filters of the multiplexers 351A to 351N can include any suitable number of boundary acoustic wave resonators in accordance with any suitable principles and advantages discussed herein. Any suitable number of multiplexers 351A to 351N can be implemented.

Figure 15:
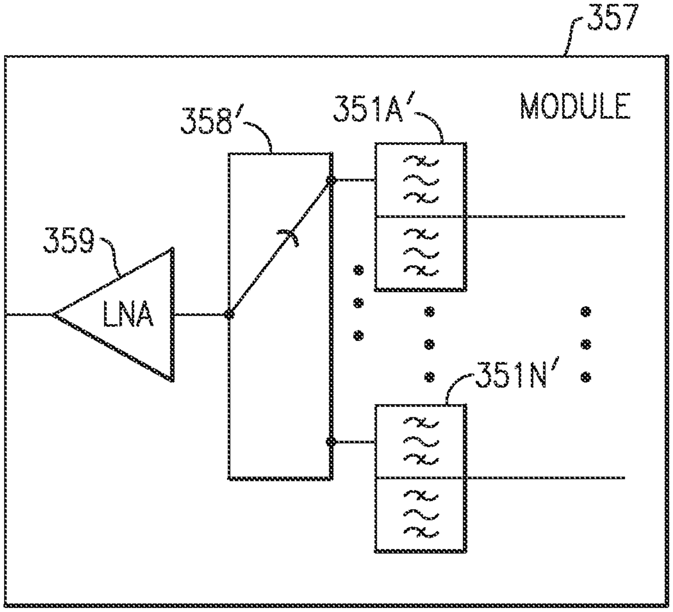

FIG. 15 is a schematic block diagram of a module 357 that includes multiplexers 351A' to 351N', a radio frequency switch 358, and a low noise amplifier 359 according to an embodiment. One or more filters of the multiplexers 351A' to 351N' can include any suitable number of boundary acoustic wave resonators in accordance with any suitable principles and advantages disclosed herein. Any suitable number of multiplexers 351A' to 351N' can be implemented. The radio frequency switch 358 can be a multi-throw radio frequency switch. The radio frequency switch 358 can electrically couple an output of a selected filter of multiplexers 351A' to 351N' to the low noise amplifier 359. In some embodiments (not illustrated), a plurality of low noise amplifiers can be implemented. The module 357 can include diversity receive features in certain applications.

Figure 16:
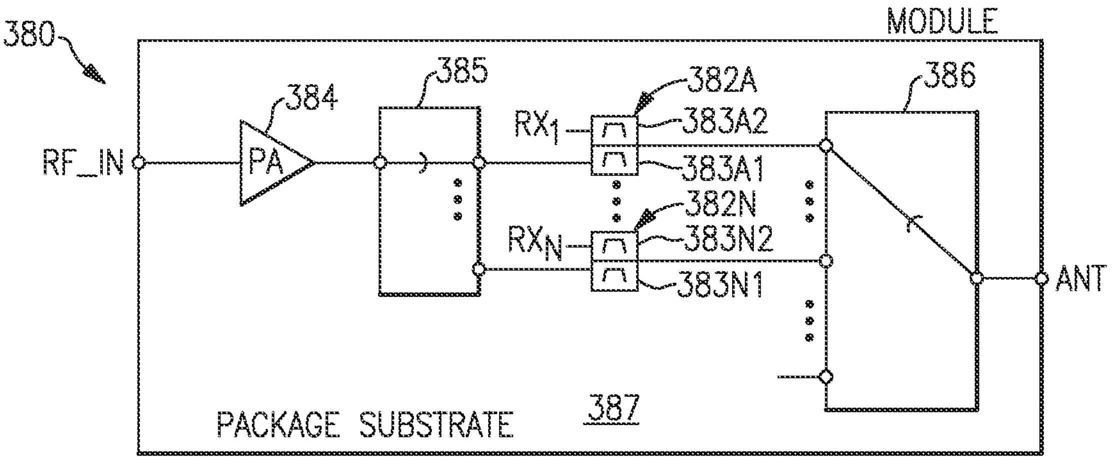

FIG. 16 is a schematic diagram of a radio frequency module 380 that includes an acoustic wave filter according to an embodiment. As illustrated, the radio frequency module 380 includes duplexers 382A to 382N that include respective transmit filters 383A1 to 383N1 and respective receive filters 383A2 to 383N2, a power amplifier 384, a switch 385, and an antenna switch 386. The radio frequency module 380 can include a package that encloses the illustrated elements. The illustrated elements can be disposed on a common packaging substrate 387. The packaging substrate 387 can be a laminate substrate, for example. A radio frequency module that includes a power amplifier can be referred to as a power amplifier module. A radio frequency module can include a subset of the elements illustrated in FIG. 16 and/or additional elements. The radio frequency module 380 may include one or more boundary acoustic wave resonators in accordance with any suitable principles and advantages disclosed herein.

The duplexers 382A to 382N can each include two acoustic wave filters coupled to a common node. For example, the two acoustic wave filters can be a transmit filter and a receive filter. As illustrated, the transmit filter and the receive filter can each be a band pass filter arranged to filter a radio frequency signal. One or more of the transmit filters 383A1 to 383N1 can include one or more boundary acoustic wave resonators in accordance with any suitable principles and advantages disclosed herein. Similarly, one or more of the receive filters 383A2 to 383N2 can include one or more boundary acoustic wave resonators in accordance with any suitable principles and advantages disclosed herein. Although FIG. 16 illustrates duplexers, any suitable principles and advantages disclosed herein can be implemented in other multiplexers (e.g., quadplexers, hexaplexers, octoplexers, etc.) and/or in switched multiplexers.

The power amplifier 384 can amplify a radio frequency signal. The illustrated switch 385 is a multi-throw radio frequency switch. The switch 385 can electrically couple an output of the power amplifier 384 to a selected transmit filter of the transmit filters 383A1 to 383N1. In some instances, the switch 385 can electrically connect the output of the power amplifier 384 to more than one of the transmit filters 383A1 to 383N1. The switch 385 can be referred to as a select switch. The antenna switch 386 can selectively couple a signal from one or more of the duplexers 382A to 382N to an antenna port ANT. The duplexers 382A to 382N can be associated with different frequency bands and/or different modes of operation (e.g., different power modes, different signaling modes, etc.).

Figure 17:
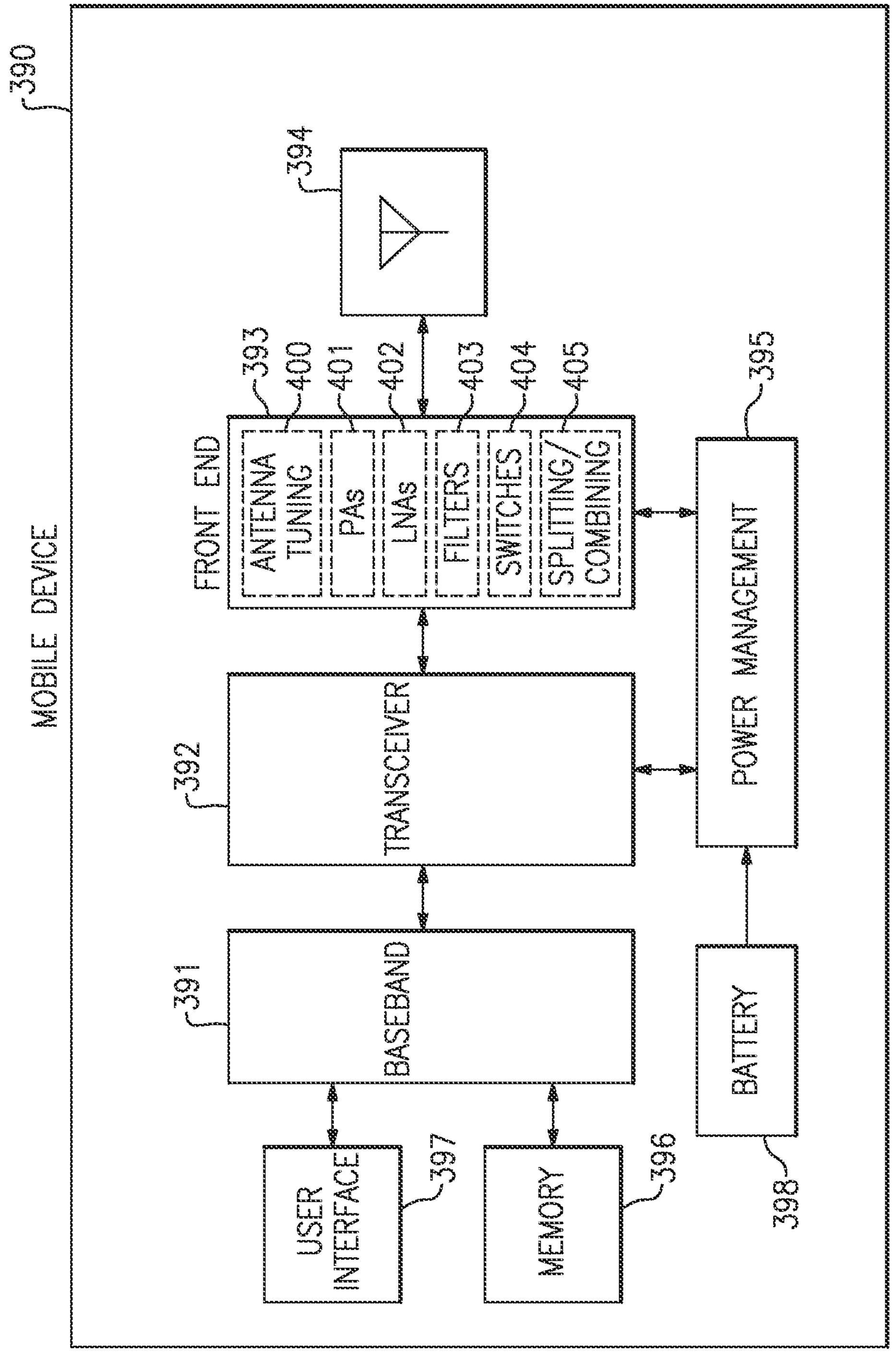
FIG. 17 is a schematic diagram of one embodiment of a mobile device.

Boundary acoustic wave devices disclosed herein can be implemented in a variety of wireless communication devices, such as mobile devices. One or more filters with any suitable number of boundary acoustic wave devices implemented with any suitable principles and advantages disclosed herein can be included in a variety of wireless communication devices, such as mobile phones. The boundary acoustic wave devices can be included in one or more filters of a radio frequency front end. FIG. 17 is a schematic diagram of one embodiment of a mobile device 390. The mobile device 390 includes a baseband system 391, a transceiver 392, a front end system 393, antennas 394, a power management system 395, a memory 396, a user interface 397, and a battery 398.

The mobile device 390 can be used communicate using a wide variety of communications technologies, including, but not limited to, second generation (2G), third generation (3G), fourth generation (4G) (including LTE, LTE-Advanced, and LTE-Advanced Pro), fifth generation (5G) New Radio (NR), wireless local area network (WLAN) (for instance, WiFi), wireless personal area network (WPAN) (for instance, Bluetooth and ZigBee), WMAN (wireless metropolitan area network) (for instance, WiMax), Global Positioning System (GPS) technologies, or any suitable combination thereof.

The transceiver 392 generates RF signals for transmission and processes incoming RF signals received from the antennas 394. It will be understood that various functionalities associated with the transmission and receiving of RF signals can be achieved by one or more components that are collectively represented in FIG. 17 as the transceiver 392. In one example, separate components (for instance, separate circuits or dies) can be provided for handling certain types of RF signals.

The front end system 393 aids in conditioning signals transmitted to and/or received from the antennas 394. In the illustrated embodiment, the front end system 393 includes antenna tuning circuitry 400, power amplifiers (PAS) 401, low noise amplifiers (LNAs) 402, filters 403, switches 404, and signal splitting/combining circuitry 405. However, other implementations are possible. One or more of the filters 403 can be implemented in accordance with any suitable principles and advantages disclosed herein. For example, one or more of the filters 403 can include at least one boundary acoustic wave resonator with piezoelectric material on opposing sides of an IDT electrode in accordance with any suitable principles and advantages disclosed herein.

The front end system 393 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or any suitable combination thereof.

In certain implementations, the mobile device 390 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 394 can include antennas used for a wide variety of types of communications. For example, the antennas 394 can include antennas for transmitting and/or receiving signals associated with a wide variety of frequencies and communications standards.

In certain implementations, the antennas 394 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 390 can operate with beamforming in certain implementations. For example, the front end system 393 can include amplifiers having controllable gain and phase shifters having controllable phase to provide beam formation and directivity for transmission and/or reception of signals using the antennas 394. For example, in the context of signal transmission, the amplitude and phases of the transmit signals provided to the antennas 394 are controlled such that radiated signals from the antennas 394 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 394 from a particular direction. In certain implementations, the antennas 394 include one or more arrays of antenna elements to enhance beamforming.

The baseband system 391 is coupled to the user interface 397 to facilitate processing of various user input and output (I/O), such as voice and data. The baseband system 391 provides the transceiver 392 with digital representations of transmit signals, which the transceiver 392 processes to generate RF signals for transmission. The baseband system 391 also processes digital representations of received signals provided by the transceiver 392. As shown in FIG. 17, the baseband system 391 is coupled to the memory 396 to facilitate operation of the mobile device 390.

The memory 396 can be used for a wide variety of purposes, such as storing data and/or instructions to facilitate the operation of the mobile device 390 and/or to provide storage of user information.

The power management system 395 provides a number of power management functions of the mobile device 390. In certain implementations, the power management system 395 includes a PA supply control circuit that controls the supply voltages of the power amplifiers 401. For example, the power management system 395 can be configured to change the supply voltage(s) provided to one or more of the power amplifiers 401 to improve efficiency, such as power added efficiency (PAE).

As shown in FIG. 17, the power management system 395 receives a battery voltage from the battery 398. The battery 398 can be any suitable battery for use in the mobile device 390, including, for example, a lithium-ion battery.

Technology disclosed herein can be implemented in acoustic wave filters in 5G applications. 5G technology is also referred to herein as 5G New Radio (NR). 5G NR supports and/or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR. An acoustic wave device including any suitable combination of features disclosed herein be included in a filter arranged to filter a radio frequency signal in a 5G NR operating band within Frequency Range 1 (FR1). A filter arranged to filter a radio frequency signal in a 5G NR operating band can include one or more boundary acoustic wave devices disclosed herein. The filter can be arranged to filter signals within FR1 and having a frequency below 5 GHz. The filter can be arranged to filter signals within FR1 and having a frequency below 3.5 GHz. FR1 can be from 410 MHz to 7.125 GHz, for example, as specified in a current 5G NR specification. One or more boundary acoustic wave devices in accordance with any suitable principles and advantages disclosed herein can be included in a filter arranged to filter a radio frequency signal in a fourth generation (4G) Long Term Evolution (LTE). One or more boundary acoustic wave devices in accordance with any suitable principles and advantages disclosed herein can be included in a filter having a passband that includes a 4G LTE operating band and a 5G NR operating band. Such a filter can be implemented in a dual connectivity application, such as an E-UTRAN New Radio-Dual Connectivity (ENDC) application.

Boundary acoustic wave devices disclosed herein can have $k^2$ for desirable performance for achieving a relatively wide passband in 5G applications. Simulations indicate that boundary acoustic wave devices in accordance with principles and advantages disclosed herein have desirable $k^2$ at 3 GHz.

Figure 18:
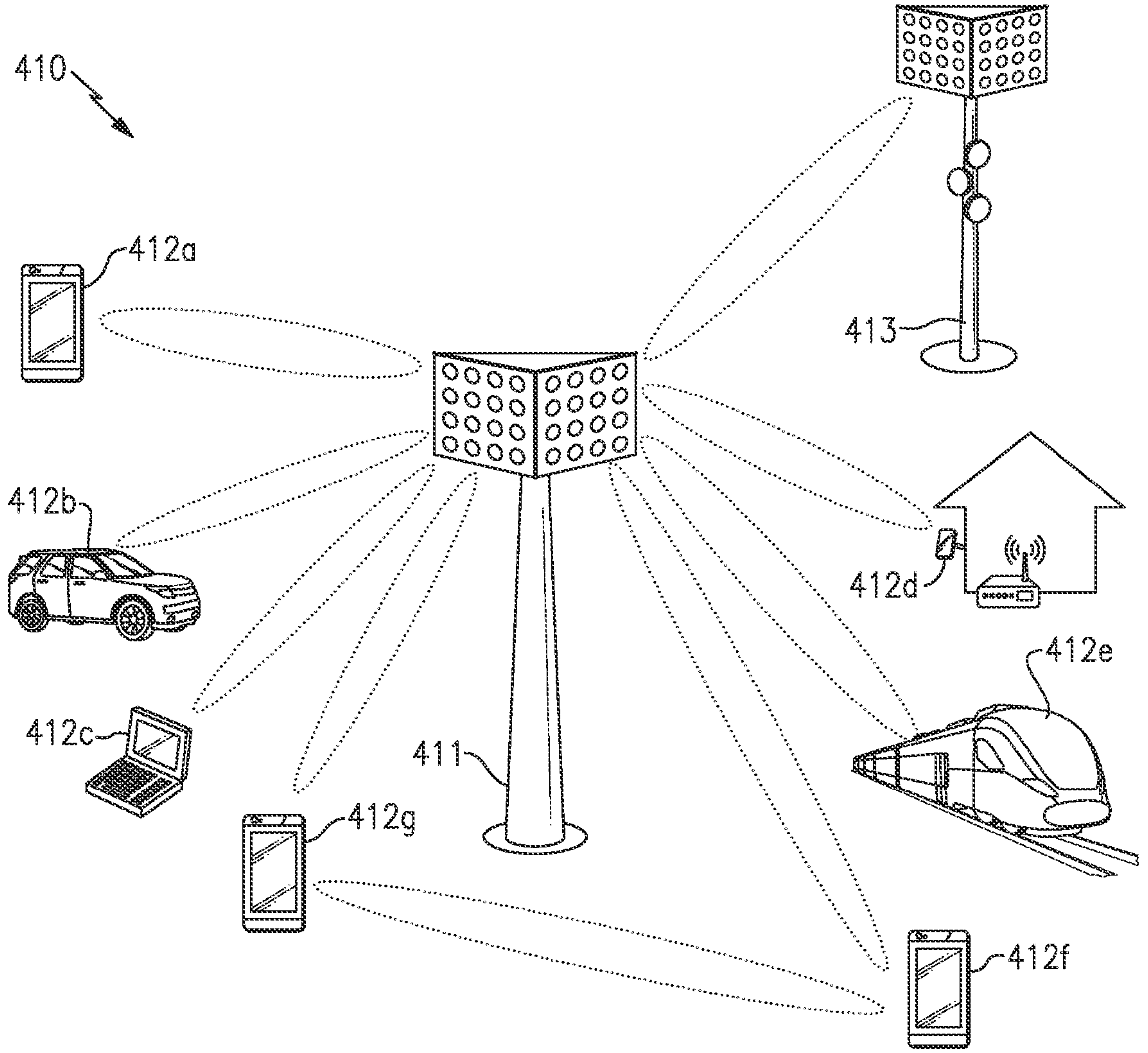
FIG. 18 is a schematic diagram of one example of a communication network.

FIG. 18 is a schematic diagram of one example of a communication network 410. The communication network 410 includes a macro cell base station 411, a small cell base station 413, and various examples of user equipment (UE), including a first mobile device 412*a*, a wireless-connected car 412*b*, a laptop 412*c*, a stationary wireless device 412*d*, a wireless-connected train 412*e*, a second mobile device 412*f*, and a third mobile device 412*g*. UEs are wireless communication devices. One or more of the macro cell base station 411, the small cell base station 413, or UEs illustrated in FIG. 18 can implement one or more of the acoustic wave filters in accordance with any suitable principles and advantages disclosed herein. For example, one or more of the UEs shown in FIG. 18 can include one or more acoustic wave filters that include any suitable number of boundary acoustic wave resonators in accordance with any suitable principles and advantages disclosed herein.

Although specific examples of base stations and user equipment are illustrated in FIG. 18, a communication network can include base stations and user equipment of a wide variety of types and/or numbers. For instance, in the example shown, the communication network 410 includes the macro cell base station 411 and the small cell base station 413. The small cell base station 413 can operate with relatively lower power, shorter range, and/or with fewer concurrent users relative to the macro cell base station 411. The small cell base station 413 can also be referred to as a femtocell, a picocell, or a microcell. Although the communication network 410 is illustrated as including two base stations, the communication network 410 can be implemented to include more or fewer base stations and/or base stations of other types.

Although various examples of user equipment are shown, the teachings herein are applicable to a wide variety of user equipment, including, but not limited to, mobile phones, tablets, laptops, Internet of Things (IoT) devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 410 of FIG. 18 supports communications using a variety of cellular technologies, including, for example, 4G LTE and 5G NR. In certain implementations, the communication network 410 is further adapted to provide a wireless local area network (WLAN), such as WiFi. Although various examples of communication technologies have been provided, the communication network 410 can be adapted to support a wide variety of communication technologies.

Various communication links of the communication network 410 have been depicted in FIG. 18. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 18, the communication links include not only communication links between UE and base stations, but also UE to UE communications and base station to base station communications. For example, the communication network 410 can be implemented to support self-fronthaul and/or self-backhaul (for instance, as between mobile device 412*g* and mobile device 412*f*).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. According to certain implementations, the communication links can serve Frequency Range 1 (FR1), Frequency Range 2 (FR2), or a combination thereof. An acoustic wave filter in accordance with any suitable principles and advantages disclosed herein can filter a radio frequency signal within FR1. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 410 can share available network resources, such as available frequency spectrum, in a wide variety of ways. In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 3 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 410 of FIG. 18 can be used to support a wide variety of advanced communication features, including, but not limited to, eMBB, uRLLC, and/or mMTC.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 3.5 GHz or in a frequency range from about 450 MHz to 5 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context indicates otherwise, throughout the description and the claims, the words “comprise,” “comprising,” “include,” “including” and the like are to generally be construed in an inclusive sense, as opposed to an exclusive or exhaustive sense; that is to say, in the sense of “including, but not limited to.” Conditional language used herein, such as, among others, “can,” “could,” “might,”

"may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel resonators described herein may be embodied in a variety of other forms. Furthermore, various omissions, substitutions and changes in the form of the resonators described herein may be made without departing from the spirit of the disclosure. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. A boundary acoustic wave device comprising:

two low acoustic impedance layers;

an interdigital transducer electrode;

piezoelectric material on opposing sides of the interdigital transducer electrode such that the piezoelectric material is positioned between the interdigital transducer electrode and each of the two low acoustic impedance layers; and two high acoustic impedance substrates, the two low acoustic impedance layers being positioned between the two high acoustic impedance substrates, the two low acoustic impedance layers each having a lower acoustic impedance than each of the two high acoustic impedance substrates, the two high acoustic impedance substrates each having a higher acoustic impedance than the piezoelectric material, at least one of the two high acoustic impedance substrates being a silicon substrate, and the boundary acoustic wave device being configured to generate a boundary acoustic wave.

2. The boundary acoustic wave device of claim 1 wherein the interdigital transducer electrode is embedded in the piezoelectric material.

3. The boundary acoustic wave device of claim 1 wherein the interdigital transducer electrode is bonded to a layer of the piezoelectric material.

4. The boundary acoustic wave device of claim 1 further comprising dielectric material located between interdigital transducer electrode fingers of the interdigital transducer electrode.

5. The boundary acoustic wave device of claim 1 further comprising a dielectric layer positioned between the interdigital transducer electrode and the piezoelectric material on one of the opposing sides of the interdigital transducer electrode.

6. A boundary acoustic wave device comprising:

two low acoustic impedance layers;

an interdigital transducer electrode;

piezoelectric material on opposing sides of the interdigital transducer electrode such that the piezoelectric material is positioned between the interdigital transducer electrode and each of the two low acoustic impedance layers;

a thermally conductive layer positioned between the interdigital transducer electrode and the piezoelectric material on one of the opposing sides of the interdigital transducer electrode; and two high acoustic impedance substrates, the two low acoustic impedance layers being positioned between the two high acoustic impedance substrates, the two low acoustic impedance layers each having a lower acoustic impedance than each of the two high acoustic impedance substrates, the two high acoustic impedance substrates each having a higher acoustic impedance than the piezoelectric material, and the boundary acoustic wave device being configured to generate a boundary acoustic wave.

7. The boundary acoustic wave device of claim 1 wherein the boundary acoustic wave device has an electromechanical coupling coefficient in a range from 10% to 25%.

8. The boundary acoustic wave device of claim 1 wherein the boundary acoustic wave device has a static capacitance in a range from 2.5 picofarads to 4 picofarads.

9. The boundary acoustic wave device of claim 1 wherein the two low acoustic impedance layers include silicon dioxide.

10. The boundary acoustic wave device of claim 1 wherein the piezoelectric material includes lithium niobate.

11. The boundary acoustic wave device of claim 1 wherein the piezoelectric material includes lithium tantalate.

12. A wireless communication device comprising:

an acoustic wave filter configured to filter a radio frequency signal, the acoustic wave filter including the boundary acoustic wave device of claim 1; and an antenna operatively coupled to the acoustic wave filter.

13. A boundary acoustic wave device comprising:

two low acoustic impedance layers;

an interdigital transducer electrode;

piezoelectric material on opposing sides of the interdigital transducer electrode such that the piezoelectric material is positioned between the interdigital transducer electrode and each of the two low acoustic impedance layers, the interdigital transducer electrode is in contact with the piezoelectric material on only one of the opposing sides of the interdigital transducer electrode; and two high acoustic impedance substrates, the two low acoustic impedance layers being positioned between the two high acoustic impedance substrates, the two low acoustic impedance layers each having a lower acoustic impedance than each of the two high acoustic impedance substrates, the two high acoustic impedance substrates each having a higher acoustic impedance than the piezoelectric material, and the boundary acoustic wave device being configured to generate a boundary acoustic wave.

14. The boundary acoustic wave device of claim 5 wherein at least one of the two high acoustic impedance substrates is a silicon substrate.

15. The boundary acoustic wave device of claim 6 further comprising a second interdigital transducer electrode, the thermally conductive layer positioned between the interdigital transducer electrode and the second interdigital transducer electrode.

16. A boundary acoustic wave device comprising:

two low acoustic impedance layers;

an interdigital transducer electrode;

piezoelectric material on opposing sides of the interdigital transducer electrode such that the piezoelectric material is positioned between the interdigital transducer electrode and each of the two low acoustic impedance layers; and two high acoustic impedance substrates, the two low acoustic impedance layers being positioned between the two high acoustic impedance substrates, the two low acoustic impedance layers each having a lower acoustic impedance than each of the two high acoustic impedance substrates, the two high acoustic impedance substrates each having a higher acoustic impedance than the piezoelectric material, at least one of the two high acoustic impedance substrates is a substrate that includes at least one of synthetic diamond, quartz, or spinel, and the boundary acoustic wave device being configured to generate a boundary acoustic wave.

17. A radio frequency module comprising:

an acoustic wave filter configured to filter a radio frequency signal, the acoustic wave filter including the boundary acoustic wave device of claim 1;

a radio frequency circuit element coupled to the acoustic wave filter; and a packaging structure enclosing the acoustic wave filter and the radio frequency circuit element.

18. The radio frequency module of claim 17 wherein the radio frequency circuit element is a radio frequency amplifier.

19. The radio frequency module of claim 17 wherein the radio frequency circuit element is a switch.

20. The wireless communication device of claim 12 wherein the wireless communication device is a mobile phone.

* * * * *